(12) United States Patent
Kaneko et al.

(10) Patent No.: US 7,938,130 B2
(45) Date of Patent: May 10, 2011

(54) SUBSTRATE HOLDING ROTATING MECHANISM, AND SUBSTRATE PROCESSING APPARATUS

(75) Inventors: Hiroyuki Kaneko, Tokyo (JP); Takahiro Ogawa, Tokyo (JP); Kenichi Sugita, Tokyo (JP)

(73) Assignee: Ebara Corporation, Tokyo (JP)

( * ) Notice: Subject to any disclaimer, the term of this patent is extended or adjusted under 35 U.S.C. 154(b) by 667 days.

(21) Appl. No.: 11/730,309

(22) Filed: Mar. 30, 2007

(65) Prior Publication Data

US 2007/0226992 A1 Oct. 4, 2007

(30) Foreign Application Priority Data

Mar. 31, 2006 (JP) ................................ 2006-100178

(51) Int. Cl.
*B08B 3/02* (2006.01)
(52) U.S. Cl. ........ 134/157; 134/137; 134/151; 134/153; 134/902
(58) Field of Classification Search ............. 15/77, 88.2, 15/88.3, 102; 134/149, 153, 157, 158, 902, 134/137, 151; 269/57, 245
See application file for complete search history.

(56) References Cited

U.S. PATENT DOCUMENTS

| 5,966,765 | A | | 10/1999 | Hamada et al. | |
|---|---|---|---|---|---|
| 6,003,185 | A | * | 12/1999 | Saenz et al. | ........................ 15/77 |
| 6,012,192 | A | | 1/2000 | Sawada et al. | |
| 6,079,073 | A | | 6/2000 | Maekawa | |
| 6,385,805 | B2 | * | 5/2002 | Konishi et al. | ..................... 15/77 |
| 6,530,157 | B1 | * | 3/2003 | Henderson et al. | ............. 33/644 |
| 6,837,777 | B2 | * | 1/2005 | Ziemins et al. | ................. 451/44 |
| 6,851,152 | B2 | * | 2/2005 | Sotozaki et al. | ............... 15/88.3 |
| 6,932,884 | B2 | * | 8/2005 | Saito et al. | ............. 156/345.17 |
| 6,936,107 | B2 | * | 8/2005 | Kitano et al. | ................. 118/676 |
| 6,951,221 | B2 | * | 10/2005 | Okuda et al. | ................ 134/56 R |

FOREIGN PATENT DOCUMENTS

| JP | 6-132381 | 5/1994 |
|---|---|---|
| JP | 9-226987 | 9/1997 |
| JP | 10-180198 | 7/1998 |
| JP | 10-264071 | 10/1998 |
| JP | 10-294304 | 11/1998 |
| JP | 10-335283 | 12/1998 |

* cited by examiner

*Primary Examiner* — Joseph L Perrin
*Assistant Examiner* — Benjamin Osterhout
(74) *Attorney, Agent, or Firm* — Wenderoth, Lind & Ponack, L.L.P.

(57) ABSTRACT

A substrate holding rotating mechanism is used to hold and rotate a substrate to be processed. The substrate holding rotating mechanism according to the present invention includes at least three spindles, clamp rollers mounted respectively on the spindles for holding a periphery of a substrate, a rotating device for rotating at least one of the clamp rollers, at least one base member on which at least one of the spindles is installed, and a rotational mechanism adapted to allow the base member to be rotatable.

10 Claims, 18 Drawing Sheets

A-A

B-B

C

US 7,938,130 B2

SUBSTRATE HOLDING ROTATING MECHANISM, AND SUBSTRATE PROCESSING APPARATUS

BACKGROUND OF THE INVENTION

1. Field of the Invention

The present invention relates to a substrate holding rotating mechanism having plural spindles that hold and rotate a substrate, and also relates to a substrate processing apparatus having such a substrate holding rotating mechanism.

2. Description of the Related Art

As disclosed in Japanese laid-open patent publication No. 10-180198, there has been known a substrate holding rotating mechanism for use in cleaning or polishing a substrate, such as a semiconductor wafer. FIGS. 1A and 1B are schematic views each showing this kind of substrate holding rotating mechanism as viewed from above. As shown in FIG. 1A, this substrate holding rotating mechanism includes spindle groups 102 and 102, each comprising plural (two in the drawing) spindles 101, on both sides of a substrate W. The spindle groups 102 and 102 are provided respectively on plate-shaped base members 100 and 100, which are mounted on moving mechanisms (not shown in the drawings) that cause the base members 100 and 100 to move between substrate holding positions and waiting positions. The substrate holding rotating mechanism is operable to move the spindle groups 102 and 102 from the waiting positions to the substrate holding positions so as to bring clamp rollers 101a, provided on the respective spindles 101, into contact with a periphery of the substrate W to thereby hold (clamp) the substrate W. While holding the substrate W, the clamp rollers 101a are rotated to thereby rotate the substrate W.

This substrate holding rotating mechanism is designed such that, when holding the substrate W, the spindles 101 are positioned on the same circle as viewed from above, so that the clamp rollers 101a on the spindles 101 can press the periphery of the substrate W with equal pressures. However, the spindles 101 may be slightly off from the same circle due to deviation of the base members 100 from proper installation sites thereof, backlash of the moving mechanisms, or other causes. As a result, only one of the spindles 101 and 101 may come into contact with the substrate W, as shown in FIG. 1B, or even if both the spindles 101 come into contact with the substrate W, holding pressures thereof are not equal to one another. In other words, the clamp rollers 101a on the spindles 101 cannot apply equal holding pressures to the substrate W. Such unequal holding pressures would cause unstable rotation of the substrate W held by the clamp rollers 101a, resulting in a lowered efficiency of processing, such as cleaning, of the substrate W. Further, processing of many substrates with unequal holding pressures would cause a difference in wear of the clamp rollers 101a. As a result, replacement of the clamp rollers 101a is required prior to progression of wear, incurring an increased component cost and causing a lowered operating rate of the apparatus due to frequent maintenance.

SUMMARY OF THE INVENTION

The present invention has been made in view of the above drawbacks. It is therefore an object of the present invention to provide a substrate holding rotating mechanism which has clamp rollers adapted to apply equal substrate-holding pressures to a periphery of a substrate to thereby achieve stable rotation of the substrate, and which can prevent uneven wear of the clamp rollers that have held a number of substrates. It is also an object of the present invention to provide a substrate processing apparatus having such a substrate holding rotating mechanism.

One aspect of the present invention is to provide a substrate holding rotating mechanism including at least three spindles, clamp rollers mounted respectively on the spindles for holding a periphery of a substrate, a rotating device for rotating at least one of the clamp rollers, at least one base member on which at least one of the spindles is installed, and a rotational mechanism adapted to allow the base member to be rotatable. The base member is free to rotate so as to adjust holding pressures of the clamp rollers applied to the substrate.

In a preferred aspect of the present invention, the rotational mechanism is adapted to allow the base member to be rotatable about a shaft member mounted on the base member.

In a preferred aspect of the present invention, the substrate holding rotating mechanism further includes a reciprocating mechanism adapted to move the base member forward and backward in a direction such that the at least one spindle on the base member moves between a substrate clamp position and a waiting position that is away from the substrate clamp position.

In a preferred aspect of the present invention, the at least one base member comprises plural base members, and each of the plural base members is provided with at least one of the rotational mechanism and the reciprocating mechanism.

Another aspect of the present invention is to provide a substrate holding rotating mechanism including at least three spindles, clamp rollers mounted respectively on the spindles for holding a periphery of a substrate, a rotating device for rotating at least one of the clamp rollers, at least one base member on which at least one of the spindles is installed, and at least one reciprocating mechanism adapted to move the base member forward and backward in a direction such that the at least one spindle on the base member moves between a substrate clamp position and a waiting position that is away from the substrate clamp position.

In a preferred aspect of the present invention, the at least one base member comprises a pair of base members arranged on both sides of the substrate clamp position, the at least one reciprocating mechanism comprises a pair of reciprocating mechanisms coupled respectively to the pair of base members, and the pair of reciprocating mechanisms are operable to move the spindles on the pair of base members forward and backward along a common linear line.

In a preferred aspect of the present invention, the substrate holding rotating mechanism further includes at least one rotational mechanism adapted to allow at least one of the pair of base members to be rotatable. At least one of the pair of base members is free to rotate so as to adjust holding pressures of the clamp rollers applied to the substrate.

Another aspect of the present invention is to provide a substrate holding rotating mechanism including a pair of first base members rotatable about a pair of first shaft members, respectively, a second base member rotatable about a second shaft member, plural spindles installed on the pair of first base members and the second base member, a single drive mechanism for rotating the pair of first base members about the pair of first shaft members, respectively, plural clamp rollers mounted respectively on the plural spindles for holding a substrate, and a rotating device for rotating at least one of the plural clamp rollers. Rotation of the pair of first base members allows at least two of the plural clamp rollers to move in directions toward and away from the substrate.

In a preferred aspect of the present invention, the substrate holding rotating mechanism further includes at least one substrate push-out member provided on at least one of the pair of first base members. When the pair of first base members rotate so as to move the at least two plural clamp rollers in the direction away from the substrate, the substrate push-out member is brought into contact with a periphery of the substrate.

In a preferred aspect of the present invention, the substrate holding rotating mechanism further includes a substrate stopper disposed near a periphery of the substrate held by the plural clamp rollers, wherein the substrate stopper and the second base member are substantially symmetrical about a center of the substrate.

In a preferred aspect of the present invention, the substrate holding rotating mechanism further includes a pair of coupling members for coupling the pair of first base members and the second shaft member. The second shaft member is configured to move in a radial direction of the substrate.

Another aspect of the present invention is to provide a substrate processing apparatus including the above-described substrate holding rotating mechanism, a processing liquid supply mechanism for supplying a processing liquid to a substrate, and a substrate processing section for processing the substrate.

In a preferred aspect of the present invention, the substrate processing apparatus further includes a pre-treatment unit for performing a pre-treatment on the substrate before the substrate processing section processes the substrate. The substrate processing section performs a post-treatment on the substrate after the pre-treatment unit performs the pre-treatment on the substrate.

In a preferred aspect of the present invention, the pre-treatment in the pre-treatment unit is a polishing process on the substrate, and the post-treatment in the substrate processing section is a cleaning process on the substrate.

DETAILED DESCRIPTION OF THE PREFERRED EMBODIMENTS

First Embodiment

A Substrate Cleaning Apparatus Having a Substrate Holding Rotating Mechanism

Figure 1A:
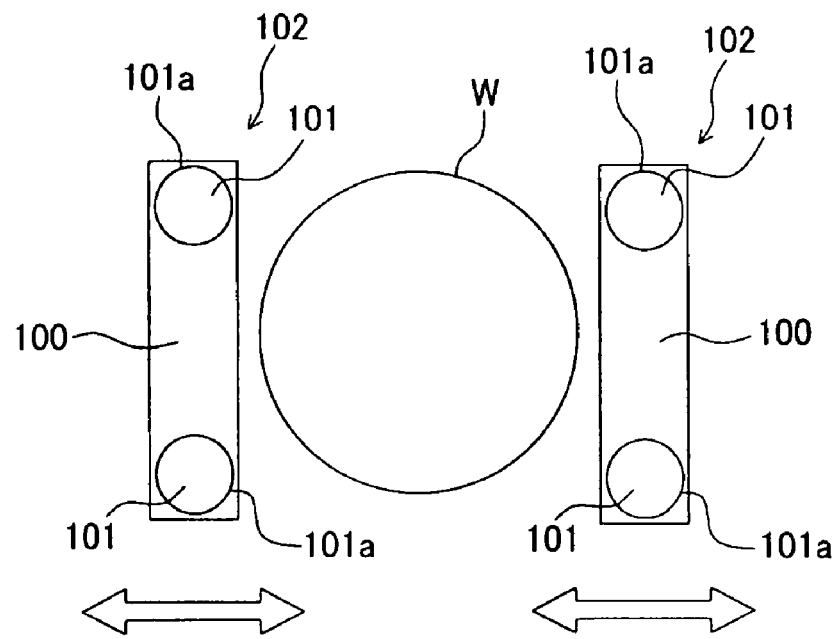
FIGS. 1A and 1B are schematic views each showing structures and operations of a conventional substrate holding rotating mechanism.
Figure 1B:
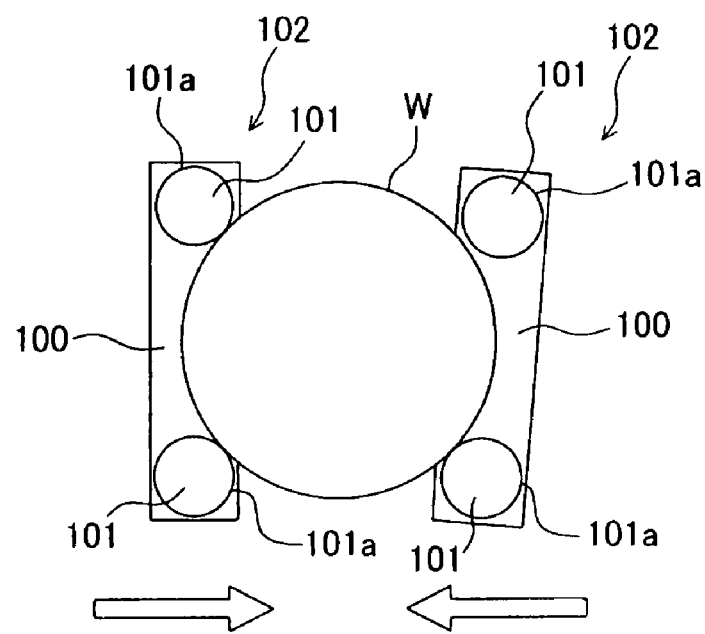
Figure 2:
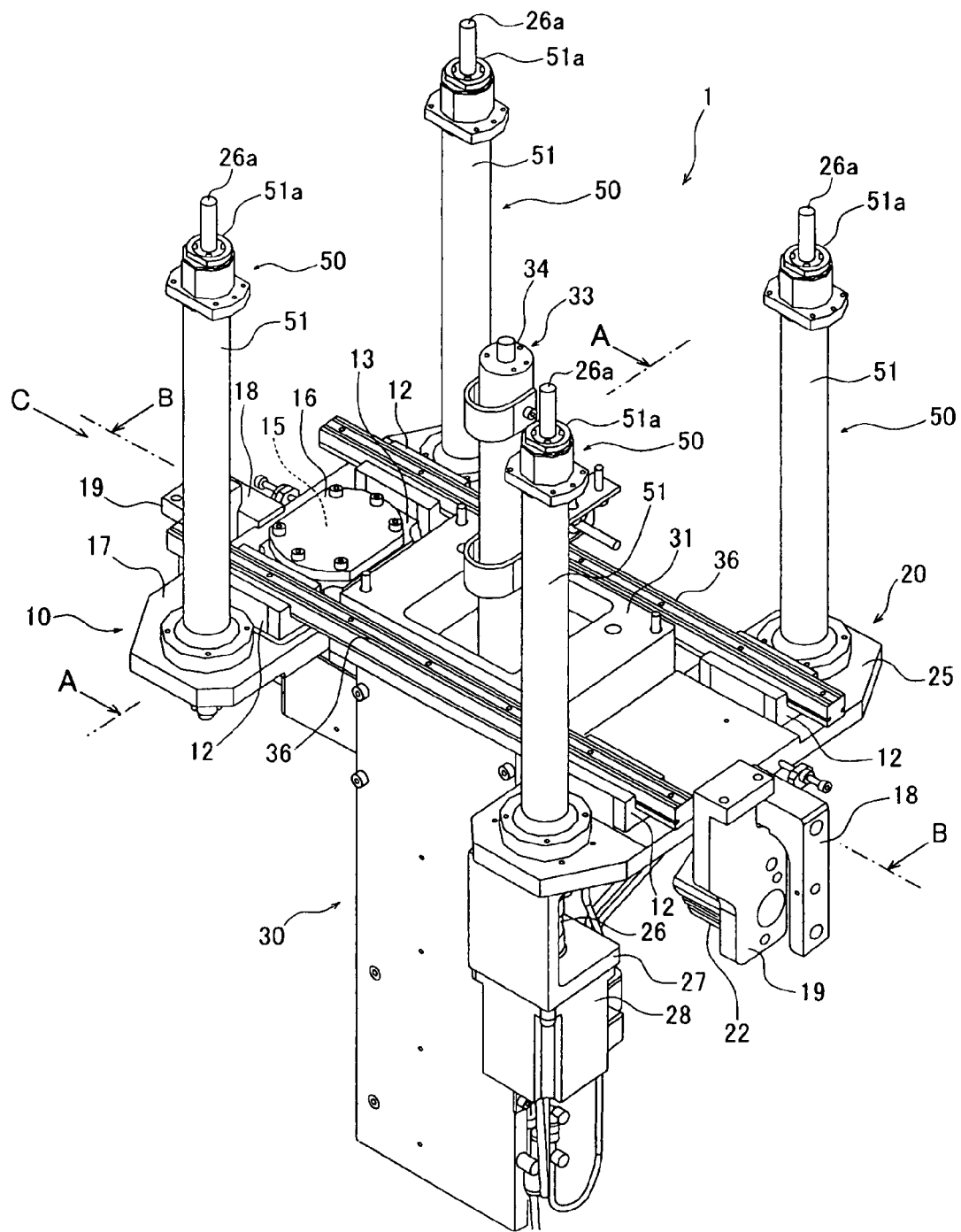
FIG. 2 is a perspective view showing a substrate holding rotating mechanism incorporated in a substrate cleaning apparatus according to a first embodiment of the present invention.
Figure 3:
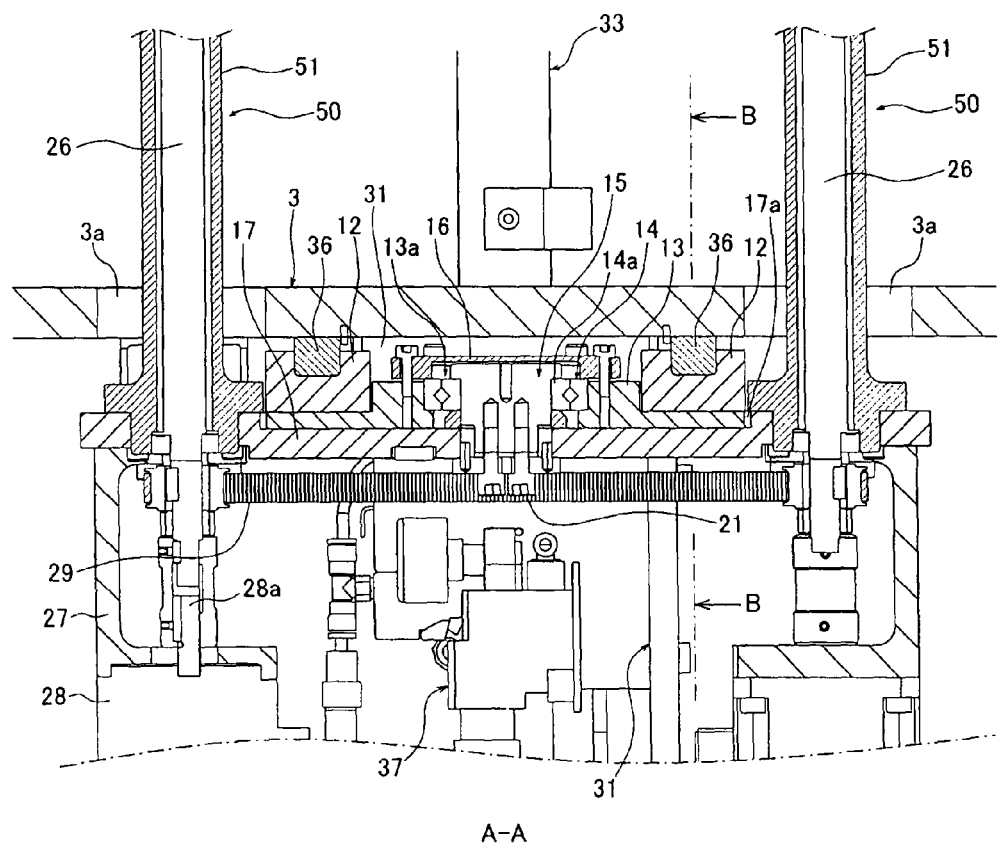
FIG. 3 is a cross-sectional view taken along line A-A in FIG. 2.
Figure 4:
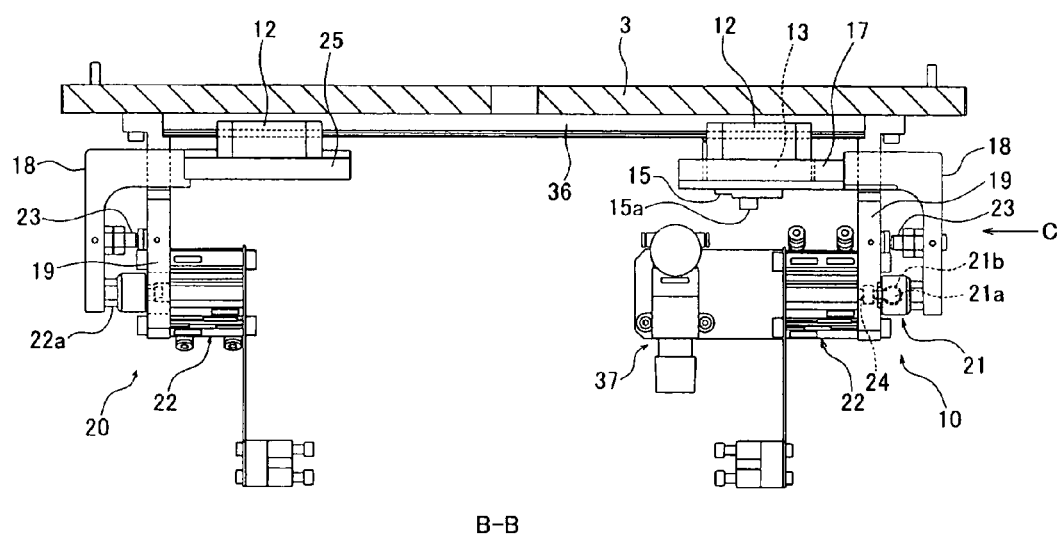
FIG. 4 is a cross-sectional view taken along line B-B in FIG. 2.
Figure 5:
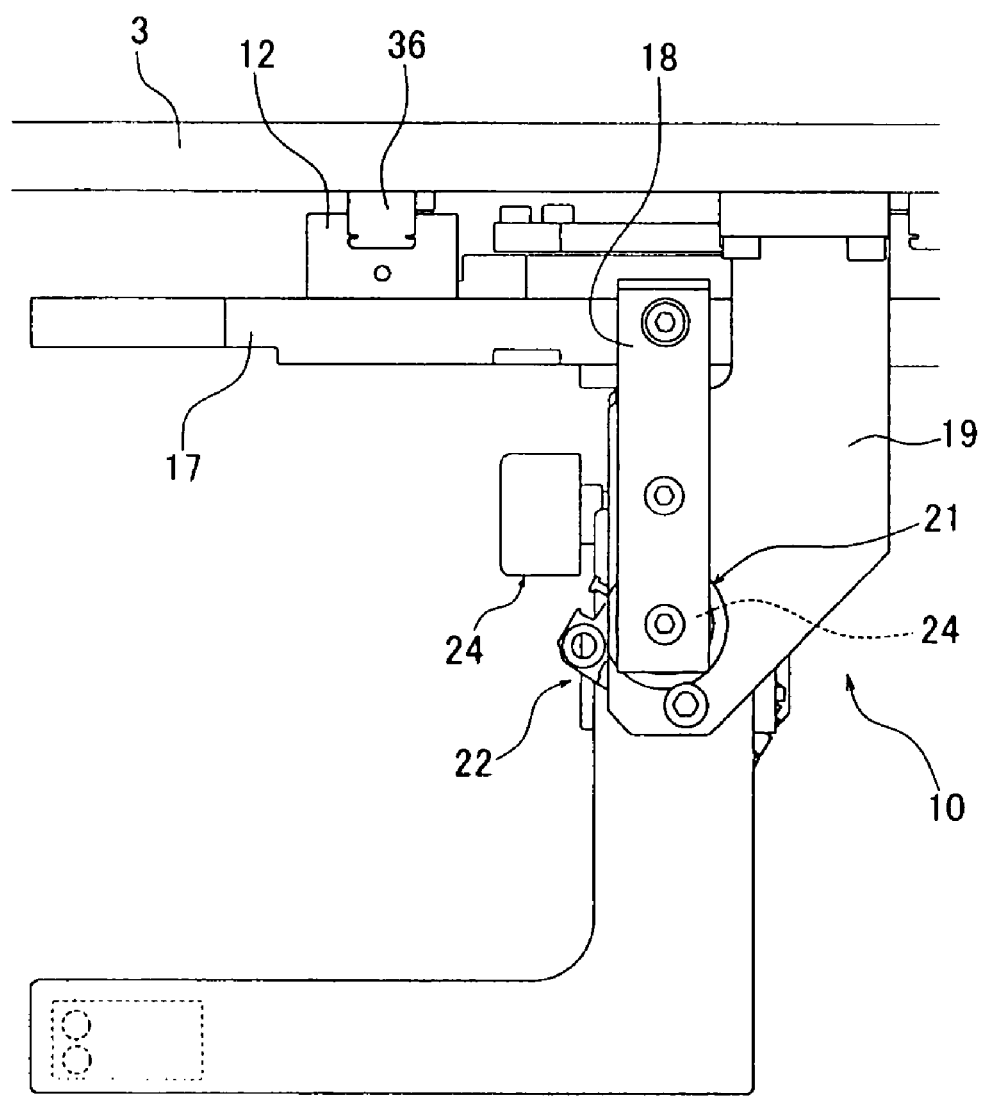
FIG. 5 is a view from a direction indicated by arrow C in FIG. 2.
Figure 6:
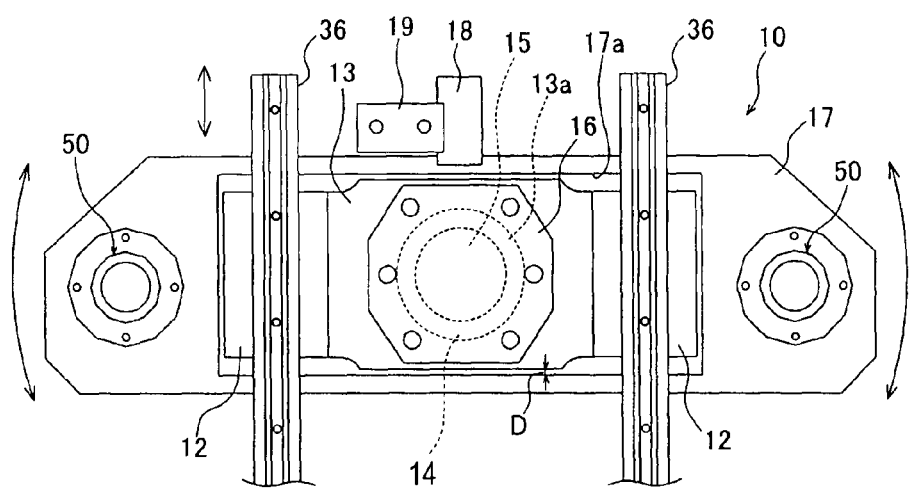
FIG. 6 is a schematic plan view showing a first moving mechanism.
Figure 7:
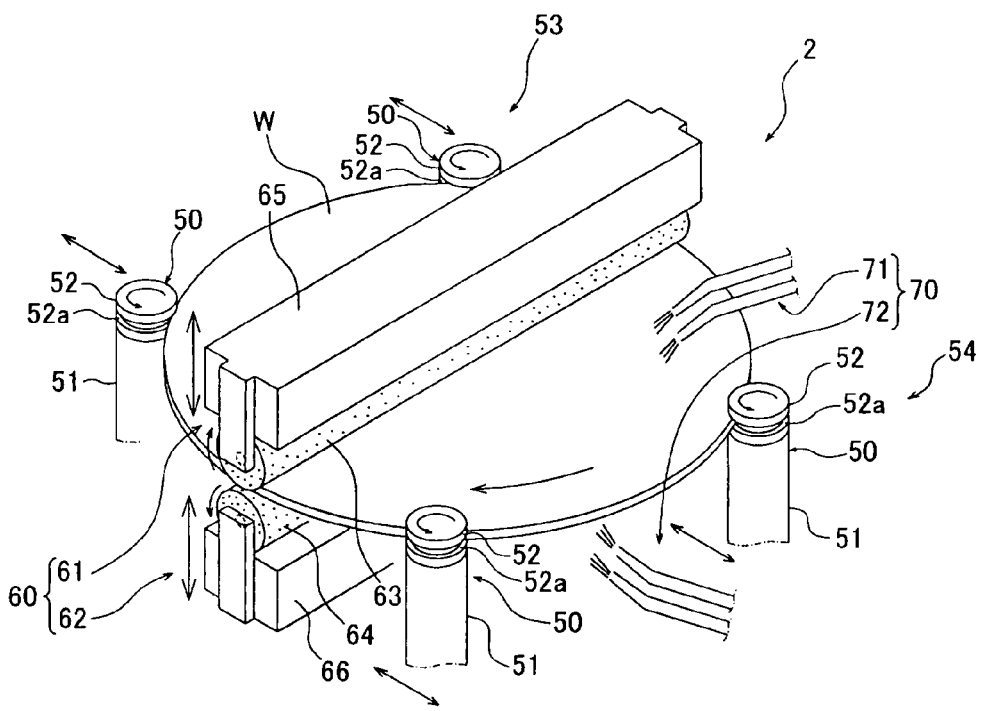
FIG. 7 is a perspective view showing a substrate cleaning mechanism incorporated in the substrate cleaning apparatus according to the first embodiment.

Embodiments of the present invention will be described below in detail with reference to the drawings. FIG. 2 is a perspective view showing a structure of a substrate holding rotating mechanism incorporated in a substrate cleaning apparatus according to an embodiment of the present invention. FIG. 3 is a cross-sectional view taken along line A-A in FIG. 2. FIG. 4 is a cross-sectional view taken along line B-B in FIG. 2. FIG. 5 is a view from a direction indicated by arrow C in FIG. 2 (FIG. 4). FIG. 6 is a schematic plan view showing a first moving mechanism 10. FIG. 7 is a perspective view showing a structure of a substrate cleaning mechanism incorporated in the substrate cleaning apparatus. This substrate cleaning apparatus comprises a substrate holding rotating mechanism 1 shown in FIG. 2 and a substrate cleaning mechanism 2 shown in FIG. 7. The substrate cleaning mechanism 2 is installed on the holding rotating mechanism 1, and these mechanisms 1 and 2 are integrally assembled.

The substrate holding rotating mechanism 1 will be first described. As shown in FIG. 2, the substrate holding rotating mechanism 1 comprises a cleaning tool driving mechanism 30 arranged at a center thereof, and a first moving mechanism 10 and a second moving mechanism 20 for respectively moving spindle groups 53 and 54 shown in FIG. 7. These first and second moving mechanisms 10 and 20 are arranged on both sides of the cleaning tool driving mechanism 30.

The cleaning tool driving mechanism 30 comprises a cylinder 32 (not shown in FIG. 3) provided inside a case 31 shown in FIG. 3, and a rod-shaped column 33 driven by the cylinder 32. The column 33 extends upwardly from the cylinder 32 and is vertically moved by the cylinder 32. A mount portion 34 is provided at an upper end of the column 33, and a lower cleaning tool 62 (see FIG. 7) of a cleaning tool 60 is mounted on the mount portion 34. On both sides of the case 31, a pair of linear slide rails 36 and 36 are provided in parallel to one another so that the case 31 is interposed therebetween. The first moving mechanism 10 and the second moving mechanism 20 are slidably mounted respectively on both ends of the slide rails 36 and 36.

Next, the first moving mechanism 10 will be described. As shown in FIGS. 2, 3 and 6, a pair of sliders 12 and 12, each having an approximately U-shaped cross section, slidably engage lower portions of the slide rails 36 and 36, and are located adjacent to ends of the slide rails 36 and 36. An approximately rectangular plate-shaped connection member 13 is mounted on lower surfaces of the sliders 12 and 12. An aperture 13a extends vertically through a center of the connection member 13, and a bearing 14 is fitted into the aperture 13a. A column-shaped shaft member 15 is fitted into an inner ring 14a (see FIG. 3) of the bearing 14. This bearing 14 allows the shaft member 15 to rotate relative to the connection member 13 within the aperture 13a. A cover 16 is provided on an upper end of the aperture 13a so as to cover an upper surface of the shaft member 15 installed in the aperture 13a.

An approximately rectangular plate-shaped base member 17 is provided at a lower surface side of the connection member 13. This base member 17 has an outer size larger than that of the connection member 13, and has an upper central portion joined to a lower end surface of the shaft member 15 by a bolt 15a (see FIG. 4). With this arrangement, the base member 17 is rotatable about the shaft member 15 together with the shaft member 15 in a horizontal plane, as shown in FIG. 6. The base member 17 has a rectangular recess 17a on an upper surface thereof for accommodating the lower surface of the connection member 13. A small clearance (gap) D is formed between a circumferential surface of the recess 17a and a circumferential surface of the connection member 13 (see FIG. 6). This clearance D allows the base member 17 to rotate relative to the connection member 13 to a degree such that the connection member 13 and the base member 17 do not come into contact with one another. In this embodiment, the clearance D is about 2 mm.

As shown in FIGS. 4 and 5, a guide member 18 is provided outwardly of the base member 17 (i.e., outwardly of the slide rails 36 and 36 in the longitudinal direction thereof). This guide member 18 has a L-shaped cross section and has an end portion extending downwardly. A plate-shaped engaging member 19 is provided inwardly of the guide member 18. This engaging member 19 has an upper end fixed to a partition 3 which will be described later. A cylinder 22 is provided on an inside portion of the engaging member 19. This cylinder 22 is operable to move a rod 24 forward and backward. A tip end of the rod 24 is coupled to an inside portion of the guide member 18 via a floating joint 21. Although not shown in detail in the drawings, the floating joint 21 comprises a pair of non-illustrated coupling members that are mounted on the rod 24 and the guide member 18, respectively. One of the coupling members has a spherical projection 21a, and another has a spherical recess 21b. The projection 21a rotatably engages the recess 21b. With this arrangement, the guide member 18 is movable (rotatable) with respect to the rod 24 in approximately all directions. Therefore, the cylinder 22 can move the base member 17 and the connection member 13 together forward and backward along the slide rails 36 and 36. Further, the base member 17 and the guide member 18 can freely rotate through a certain angle in a horizontal plane independently of the engaging member 19 and the cylinder 22.

As shown in FIG. 4, a stopper 23 is mounted on an inner surface of the guide member 18. This stopper 18 has a tip end that is to come into contact with an outer surface of the engaging member 19 so as to stop the movement of the base member 17 and the connection member 13 at a predetermined position. A reference numeral 37 represents a regulator connected to the cylinder 22. In summary, the first moving mechanism 10 comprises a reciprocating mechanism for linearly moving the base member 17 and the connection member 13 forward and backward together with one another along the slide rails 36 and 36, and further comprises a rotational mechanism for allowing the base member 17 to be rotatable about the shaft member 15 in a horizontal plane relative to the connection member 13.

As shown in FIGS. 3 and 6, both side portions of the base member 17 project outwardly from the slide rails 36 and 36, respectively (i.e., project in directions perpendicular to the longitudinal direction of the slide rails 36 and 36). Vertically extending spindles 50 and 50 are mounted on upper surfaces of the projecting portions of the base member 17. As shown in FIG. 3, each of the spindles 50 has a cylindrical body 51 and a shaft 26 rotatably provided in the body 51. The shaft 26 extends through the base member 17 so as to project from the lower surface of the base member 17. A motor 28 is installed on a U-shaped mount member 27 provided on the lower surface of the base member 17. A rotational shaft 28a of the motor 28 is coupled to a lower end of the shaft 26 of one of the spindles 50 and 50. Further, as shown in FIG. 3, a transmission belt 29 rides the shafts 26 and 26 of the spindles 50 and 50, so that rotation of one of the shafts 26 and 26 is transmitted to another. As shown in FIG. 2, each of the spindles 50 and 50 has a mount base 51a on an upper end of the body 51. A clamp roller 52 (see FIG. 7) is connected to a top portion 26a of the shaft 26 projecting from the mount base 51a, so that rotation of the shaft 26 is transmitted to the clamp roller 52. FIG. 2 illustrates a state in which the clamp rollers 52 are removed.

As shown in FIG. 7, each of the clamp rollers 52 has a clamp groove 52a on a circumferential surface thereof. This clamp groove 52a is to be brought into contact with the periphery of the substrate W so as to hold and rotate the substrate W. The pair of spindle groups 53 and 54, each comprising the two spindles 50 and 50, are arranged so as to face one another on both sides of a wafer clamp position. These spindle groups 53 and 54 are installed respectively on the first moving mechanism 10 and the second moving mechanism 20.

The second moving mechanism 20 comprises a base member 25, which is a component corresponding to a combination of the base member 17 and the connection member 13 of the above-mentioned first moving mechanism 10. Other structures of the second moving mechanism 20 are identical to those of the first moving mechanism 10. Therefore, identical components of the second moving mechanism 20 are denoted by the same reference numerals and will not be described in detail. As shown in FIG. 2, the second moving mechanism 20 does not have components corresponding to the connection member 13 and the shaft member 15. Instead, an upper surface of the base member 25 is directly attached to lower surfaces of sliders 12 and 12. Accordingly, the second moving mechanism 20 has only a reciprocating mechanism that allows the base member 25 to linearly move forward and backward along the slide rails 36 and 36. With this arrangement, the two spindles 50 and 50 installed on the base member 25 can only move forward and backward linearly.

Next, the substrate cleaning mechanism 2 will be described. The substrate cleaning mechanism 2 shown in FIG. 7 has the cleaning tool 60 comprising an upper cleaning tool 61 and the lower cleaning tool 62 for cleaning an upper surface and a lower surface of the substrate W. The substrate cleaning mechanism 2 further has a cleaning-liquid supply mechanism 70 comprising upper nozzles 71 and lower nozzles 72 for supplying a cleaning liquid onto the upper surface and the lower surface of the substrate W. A substrate transfer mechanism 40 as shown in FIG. 8 is provided outside the substrate cleaning apparatus for transferring the substrate W to and from the wafer clamp position.

The cleaning tools 61 and 62 comprise column-shaped roll sponges 63 and 64 which are to be brought into sliding contact with the upper surface and the lower surface of the substrate W, respectively. The cleaning tools 61 and 62 further comprise mount members 65 and 66 on which the roll sponges 63 and 64 are rotatably mounted, respectively. These cleaning tools 61 and 62 are arranged so as to extend between the spindle groups 53 and 54. Each of the roll sponges 63 and 64 has a length substantially equal to a diameter of the substrate W so that the roll sponges 63 and 64 can come into sliding contact with the entire upper and lower surfaces of the substrate W. The upper cleaning tool 61 is coupled to a non-illustrated driving mechanism for vertically moving and rotating the roll sponge 63. On the other hand, the lower cleaning tool 62 is coupled to the mount portion 34 of the column 33, although not shown in detail in the drawings. The upper nozzles 71 and the lower nozzles 72 are in fluid communication with a non-illustrated cleaning-liquid supply source, so that the cleaning liquid, e.g., ultra pure water, ammonia water, or hydrofluoric acid (fluorinated acid), is supplied onto the upper surface and the lower surface of the substrate W.

Figure 8:
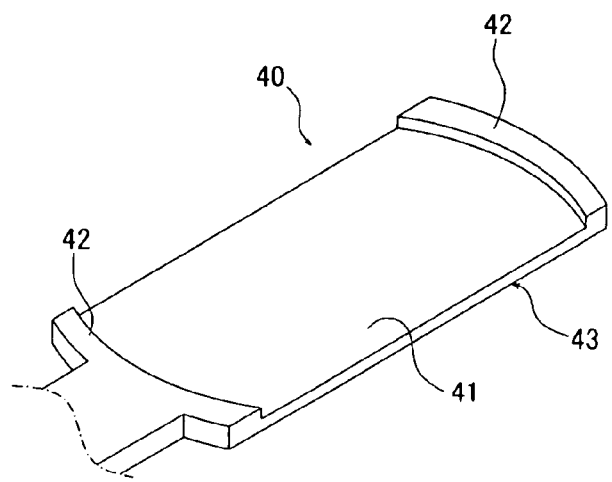
FIG. 8 is a view showing a transfer mechanism incorporated in the substrate cleaning mechanism.

The substrate transfer mechanism 40 shown in FIG. 8 comprises a plate-shaped support member 41 onto which the substrate W is placed, a robot hand 43 having guide portions 42 and 42 projecting upwardly from the support member 41 and shaped to engage the periphery of the substrate W, and a non-illustrated robot body connected to a rear end of the robot hand 43. The robot hand 43 is operable to move into and away from the wafer clamp position between the spindle groups 53 and 54.

The substrate cleaning apparatus is housed in a non-illustrated box-shaped casing. As shown in FIGS. 3 and 4, the upper surfaces of the slide rails 36 and 36 and an upper surface of the case 31 are fixed to a lower surface of the plate-shaped partition 3 provided in the casing. This partition 3 divides an inner space of the casing into a lower space in which the substrate holding rotating mechanism 1 is disposed and an upper space in which the substrate cleaning mechanism 2 is disposed, so that the cleaning liquid does not reach the substrate holding rotating mechanism 1 during cleaning of the substrate W with the substrate cleaning mechanism 2. The spindles 50 and the column 33 extend upwardly through openings 3a formed in the partition 3.

Figure 9A:
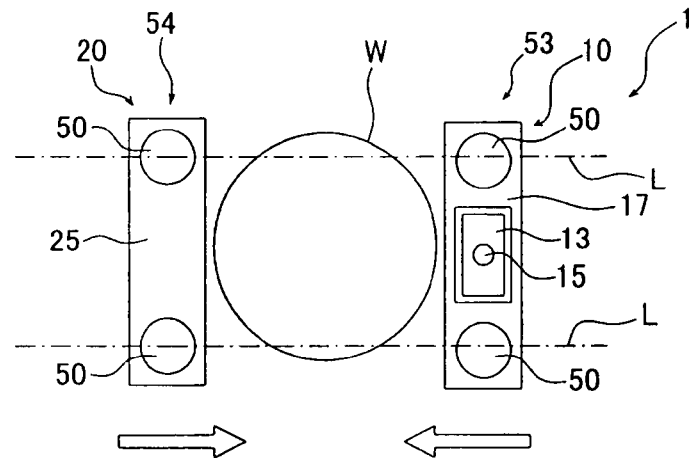
FIGS. 9A through 9C are schematic views each illustrating operations of the substrate holding rotating mechanism.

Next, operation of the substrate holding rotating mechanism 1 will be described with reference to FIGS. 9A through 9C each showing a schematic view of the substrate holding rotating mechanism 1 as viewed from above. As shown in FIG. 9A, in the substrate holding rotating mechanism 1, the spindle groups 53 and 54 on both sides of the wafer clamp position are moved by the reciprocating mechanisms of the first moving mechanism 10 and the second moving mechanism 20 toward the wafer clamp position along common linear lines L and L so as to bring the clamp rollers 52 (see FIG. 7) on the spindles 50 into contact with the periphery of the substrate W, whereby the clamp rollers 52 hold the substrate W.

Figure 9B:
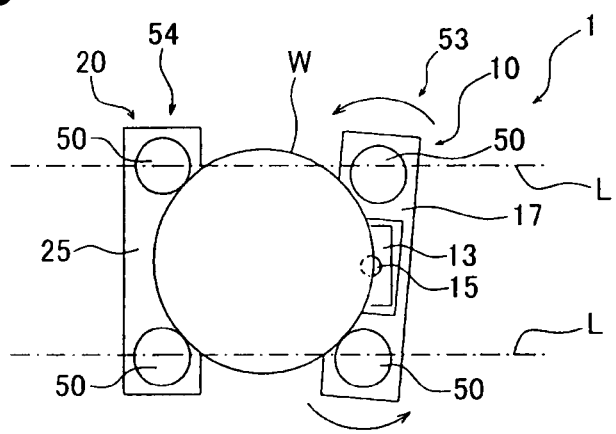
Figure 9C:
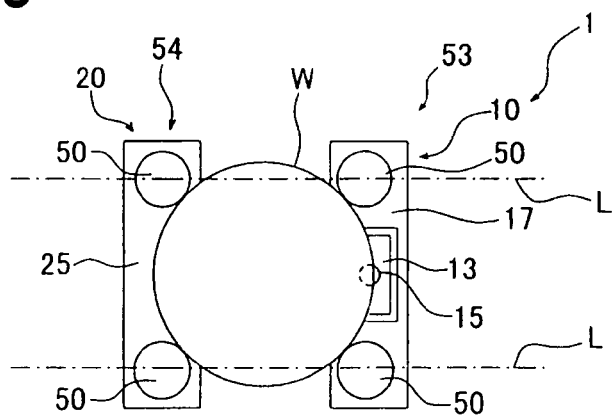

As illustrated in FIGS. 9A-9C, the shaft member 15 is non-coaxial with respect to the center of rotation of the substrate W. Upon contacting the substrate W, the clamp rollers 52 and 52 on the spindles 50 and 50 of the first moving mechanism 10 may not exert equal pressures on the periphery of the substrate W. Even in such a case, as shown in FIG. 9B, the base member 17 is rotated about the shaft member 15 through a certain angle by a force applied to one of the spindles 50 and 50 on the base member 17 upon contact between one of the clamp rollers 52 and the periphery of the substrate W. As a result, unevenness of the holding pressures applied to the substrate W can be corrected, and as shown in FIG. 9C, the clamp rollers 52 and 52 on the spindles 50 and 50 press the periphery of the substrate W with equal pressures to thus hold the substrate W.

According to the substrate holding rotating mechanism 1, because the spindles 50 and 50 on the base member 17 are free to move around a rotational axis in a horizontal plane, the holding pressures applied to the periphery of the substrate W are automatically adjusted to become equal to one another. Therefore, rotation of the substrate W, held by the clamp rollers 52, can be stable. As a result, processing of the substrate W can be performed smoothly, and variations in processing of substrates can be small. In addition, even after the clamp rollers 52 hold a lot of substrates, it is unlikely to cause a difference in degree of wear of the clamp rollers 52. Accordingly, it is not required to frequently replace the clamp rollers 52. Further, because the replacement of the clamp rollers 52 is less frequent, maintenance of the apparatus is not frequently required. Hence, an operating rate of the substrate cleaning apparatus is not lowered. The rotational mechanism can allow the base member 17 to rotate about the shaft member 15 located between the two spindles 50 and 50. Therefore, this simple mechanism can equalize the holding pressures applied from the clamp rollers 52 and 52 to the substrate W.

Next, a cleaning process of the substrate W using the substrate cleaning apparatus will be described. First, the spindle groups 53 and 54 wait in their waiting positions on both sides of the wafer clamp position. In this state, the robot hand 43, carrying the substrate W, is moved in a direction parallel to the longitudinal direction of the cleaning tools 61 and 62 so as to transfer the substrate W to the wafer clamp position. Then, the first moving mechanism 10 and the second moving mechanism 20 move the spindle groups 53 and 54 linearly toward the wafer clamp position to bring the clamp rollers 52 on the spindles 50 into contact with the periphery of the substrate W, whereby the clamp rollers 52 hold the substrate W. Upon holding the substrate W, the holding pressures applied from the clamp rollers 52 to the substrate W are automatically adjusted by the rotational mechanism of the first moving mechanism 10, as described above. Therefore, the clamp rollers 52 on the spindles 50 press the periphery of the substrate W with equal pressures.

After the substrate W is held by the clamp rollers 52 on the spindles 50, the robot hand 43 is lowered to separate from the lower surface of the substrate W, and is then moved away from the wafer clamp position. During the above-described steps, the upper cleaning tool 61 and the lower cleaning tool 62 are waiting at positions above and below the wafer clamp position.

Thereafter, the motor 28 rotates the clamp rollers 52 on the spindles 50 to thereby rotate the substrate W at a predetermined speed. The cleaning liquid is supplied through the upper nozzles 71 and the lower nozzles 72 of the cleaning-liquid supply mechanism 70 onto the upper surface and the lower surface of the substrate W. Then, the cleaning tools 61 and 62 are moved vertically with the roll sponges 63 and 64 rotating, so that the roll sponges 63 and 64 are brought into sliding contact with the upper surface and the lower surface of the substrate W to thereby scrub the upper surface and the lower surface of the substrate W. During this cleaning process, because the spindles 50 and 50 on the first moving mechanism 10 are free to move around the shaft member 15, the holding pressures of the clamp rollers 52 and 52 to the periphery of the substrate W are automatically adjusted so as to be equal to one another at all times. Therefore, rotation of the substrate W during the cleaning process can be stable, and efficient cleaning can be performed.

Second Embodiment

Another Example of Substrate Holding Rotating Mechanism

Figure 10:
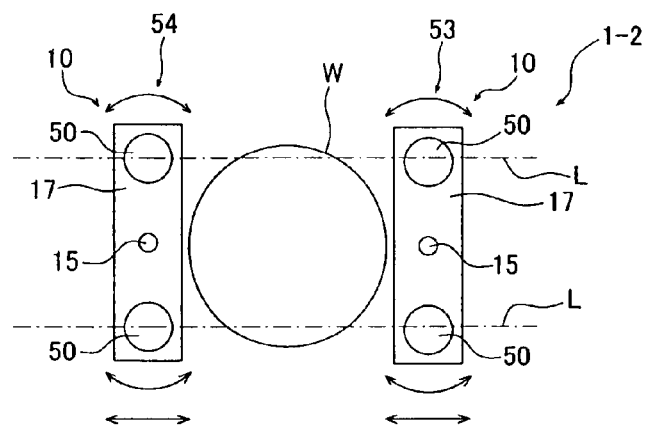
FIG. 10 is a schematic view showing a substrate holding rotating mechanism according to a second embodiment of the present invention.

Next, a substrate holding rotating mechanism according to a second embodiment of the present invention will be described. In the description and drawings of this embodiment and other embodiments, components identical to those of the first embodiment are denoted by the same reference numerals, and will not be described in detail. FIG. 10 is a schematic view showing a substrate holding rotating mechanism 1-2 as viewed from above according to the second embodiment of the present invention. This substrate holding rotating mechanism 1-2 is different from the substrate holding rotating mechanism 1 according to the first embodiment in that first moving mechanisms 10 and 10, each having the above-described rotational mechanism, are arranged on both sides of the wafer clamp position and that spindle groups 53 and 54 are installed respectively on the first moving mechanisms 10 and 10. In this substrate holding rotating mechanism 1-2, when clamp rollers 52 on spindles 50 hold the substrate W, the rotational mechanisms of both the first moving mechanisms 10 and 10 function together so as to correct unevenness of the holding pressures of both the spindle groups 53 and 54. As a result, more equal pressures than those in the substrate holding rotating mechanism 1 according to the first embodiment can be applied to hold the substrate W. In FIG. 10 and the drawings described below, the first moving mechanism 10 is illustrated in a simplified manner.

Third Embodiment

Another Example of Substrate Holding Rotating Mechanism

Next, a substrate holding rotating mechanism according to a third embodiment of the present invention will be described.

Figure 11:
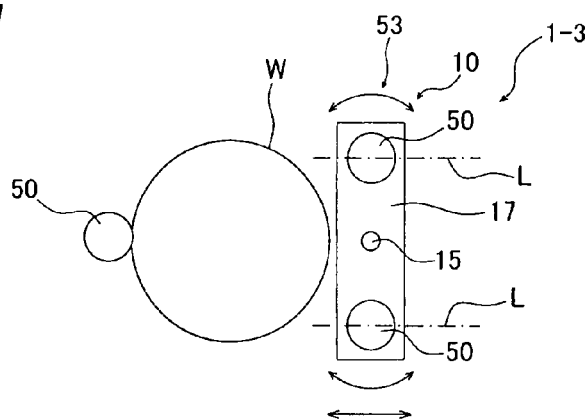
FIG. 11 is a schematic view showing a substrate holding rotating mechanism according to a third embodiment of the present invention.

FIG. 11 is a schematic view showing a substrate holding rotating mechanism 1-3 as viewed from above according to the third embodiment of the present invention. This substrate holding rotating mechanism 1-3 is different from the substrate holding rotating mechanism 1 according to the first embodiment in that only a single spindle 50 is arranged at an opposite side of first moving mechanism 10 with respect to the wafer clamp position. This spindle 50 is fixed in position and is not movable. On the other hand, spindles 50 and 50 installed on the first moving mechanism 10 are moved by the above-mentioned reciprocating mechanism toward the wafer clamp position to thereby hold the substrate W.

More specifically, the substrate holding rotating mechanism 1-3 has three spindles 50 for holding the substrate W. In this embodiment also, upon holding the substrate W, the rotational mechanism of the first moving mechanism 10 can function so as to correct unevenness of the holding pressures applied to the substrate W. With this structure, the substrate holding rotating mechanism can be more simplified.

In this type of substrate holding rotating mechanism having three spindles 50 for holding the substrate W, in particular having one immovable spindle 50 and two movable spindles 50 as in this embodiment, a central position of the substrate W depends on positions of the respective spindles 50. As a result, the central position of the substrate W may not be kept constant each time the substrate W is held. Thus, the substrate transfer mechanism 40 is preferably provided with an additional mechanism that can allow the mechanism 40 to transfer the substrate W even if the central position of the substrate W is slightly different each time the substrate W is held.

Figure 12:
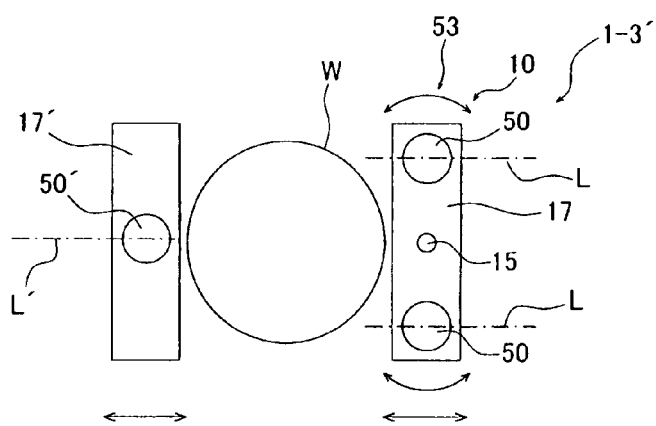
FIG. 12 is a schematic view showing a modified example of the substrate holding rotating mechanism according to the third embodiment of the present invention.

FIG. 12 shows a partly modified example of the third embodiment. This substrate holding rotating mechanism 1-3' comprises a base member 17', a single spindle 50' on the base member 17', and a reciprocating mechanism (not shown in the drawing) for moving the base member 17' forward and backward, instead of the fixed spindle 50 of the substrate holding rotating mechanism 1-3 shown in FIG. 11. The reciprocating mechanism moves the spindle 50' on the base member 17' forward and backward in a direction along the linear lines L and L that indicate the moving direction of the spindles 50 and 50 driven by the first moving mechanism 10 (i.e., in a direction of a linear line L' that is in parallel to the lines L and L).

Fourth Embodiment

Another Example of Substrate Holding Rotating Mechanism

Figure 13:
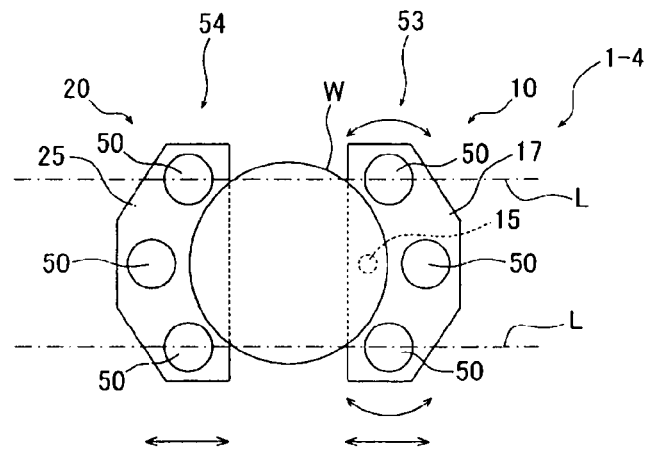
FIG. 13 is a schematic view showing a substrate holding rotating mechanism according to a fourth embodiment of the present invention.

Next, a substrate holding rotating mechanism according to a fourth embodiment of the present invention will be described. FIG. 13 is a schematic view showing a substrate holding rotating mechanism 1-4 as viewed from above according to the fourth embodiment of the present invention. This substrate holding rotating mechanism 1-4 is different from the substrate holding rotating mechanism 1 according to the first embodiment in that three spindles 50 are installed on each of first moving mechanism 10 and second moving mechanism 20 which are arranged on both sides of the wafer clamp position. More specifically, three spindles 50 are installed on each of base members 17 and 25, and a total of six spindles 50 are arranged on the same circle when viewed from above. With this structure, clamp rollers 52 on the six spindles 50 can hold the substrate W more stably. In this case also, upon holding the substrate W, the rotational mechanism of the first moving mechanism 10 can function so as to correct unevenness of the holding pressures of the spindles 50 on the first moving mechanism 10.

Fifth Embodiment

Another Example of Substrate Holding Rotating Mechanism

Figure 14:
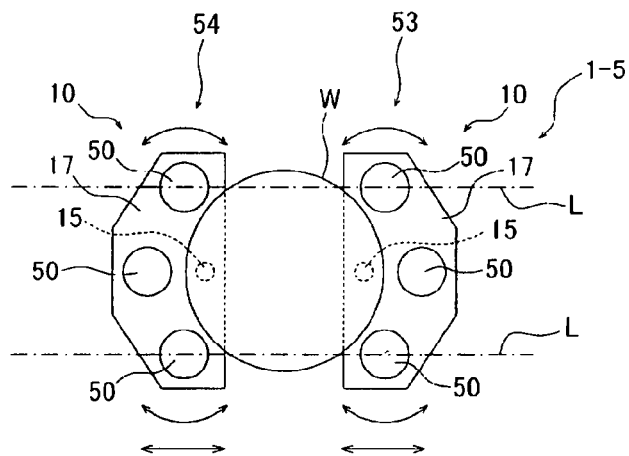
FIG. 14 is a schematic view showing a substrate holding rotating mechanism according to a fifth embodiment of the present invention.

Next, a substrate holding rotating mechanism according to a fifth embodiment of the present invention will be described. FIG. 14 is a schematic view showing a substrate holding rotating mechanism 1-5 as viewed from above according to the fifth embodiment of the present invention. This substrate holding rotating mechanism 1-5 is different from the substrate holding rotating mechanism 1 according to the first embodiment in that three spindles 50 are installed on each of first moving mechanisms 10 and 10 which are arranged on both sides of the wafer clamp position. In this substrate holding rotating mechanism 1-5, upon holding the substrate W, the rotational mechanisms of both the first moving mechanisms 10 function so as to correct unevenness of the holding pressures applied to the substrate W. As a result, the substrate W can be held with more equal holding pressures, compared with the substrate holding rotating mechanism 1-4 according to the fourth embodiment.

Sixth Embodiment

Another Example of Substrate Holding Rotating Mechanism

Figure 15:
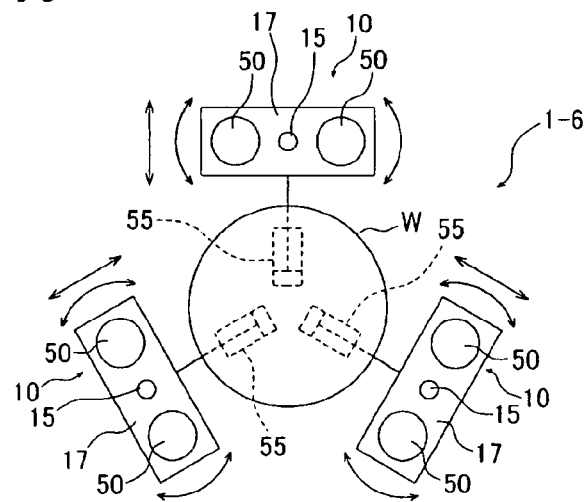
FIG. 15 is a schematic view showing a substrate holding rotating mechanism according to a sixth embodiment of the present invention.

Next, a substrate holding rotating mechanism according to a sixth embodiment of the present invention will be described. FIG. 15 is a schematic view showing a substrate holding rotating mechanism 1-6 as viewed from above according to the sixth embodiment of the present invention. This substrate holding rotating mechanism 1-6 comprises three first moving mechanisms 10 arranged at equal intervals around the wafer clamp position. Each of the three moving mechanisms 10 has two spindles 50. Therefore, a total of six spindles 50 are provided for holding the substrate W. All the spindles 50 on the first moving mechanisms 10 are movable forward and backward along linear lines directed to the wafer clamp position (i.e., the center of the substrate W held at the wafer clamp position). In this substrate holding rotating mechanism 1-6, rotational mechanisms of the three first moving mechanisms 10 can correct unevenness of the holding pressures applied to the substrate W. Therefore, the substrate W can be held with more equal holding pressures, compared with the substrate holding rotating mechanism according to the above embodiments. A reference numeral 55 represents a cylinder for moving the base member 17 forward and backward. This embodiment is advantageous in that reciprocating mechanisms can be simplified. Any one of the three first moving mechanisms 10 can be replaced with the second moving mechanism 20 that allows the spindles 50 thereon to only move forward and backward.

Seventh Embodiment

Another Example of Substrate Holding Rotating Mechanism

Figure 16:
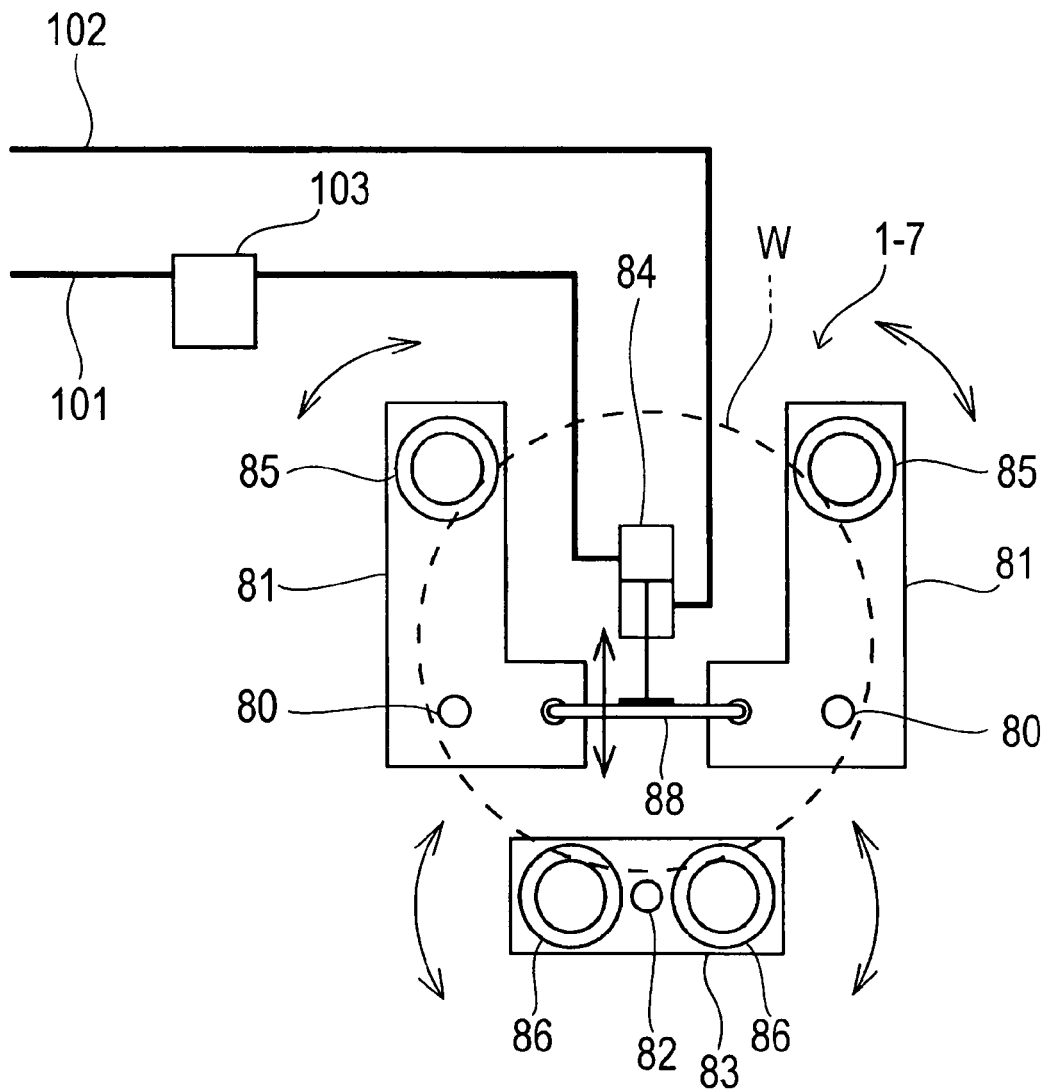
FIG. 16 is a schematic view showing a substrate holding rotating mechanism according to a seventh embodiment of the present invention.

Next, a substrate holding rotating mechanism according to a seventh embodiment of the present invention will be described. FIG. 16 is a schematic view showing a substrate holding rotating mechanism 1-7 as viewed from above according to the seventh embodiment of the present invention.

As shown in FIG. 16, the substrate holding rotating mechanism 1-7 comprises base members (first base members) 81 and 81 rotatable about shaft members (first shaft members) 80 and 80, respectively, and a base member (second base member) 83 rotatable about a shaft member (second shaft member) 82. Clamp rollers 85 and 85 are coupled to the base members 81 and 81 via spindles 50 and 50 (see FIG. 7), respectively. Two clamp rollers 86 and 86 are coupled to the base member 83 via spindles 50 and 50. Although the spindles 50 are not shown in FIG. 16, the spindles 50 are disposed underneath the clamp rollers 85, 85, 86 and 86.

The clamp rollers 85, 85, 86 and 86 are rotatable about their own axes. The clamp rollers 86 and 86 are arranged symmetrically about the shaft member 82. The base members 81 and 81 are coupled to one another via a coupling member 88, which is coupled to an air cylinder (drive mechanism) 84. This air cylinder 84 is operable to move the coupling member 88 in a direction indicated by the arrow (i.e., a radial direction of a substrate W at wafer clamp position).

Figure 17:
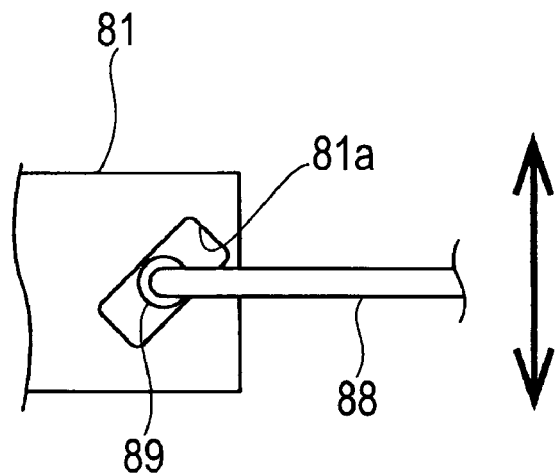
FIG. 17 is an enlarged view showing an example of a linking structure between a coupling member and a base member shown in FIG. 16.
Figure 18:
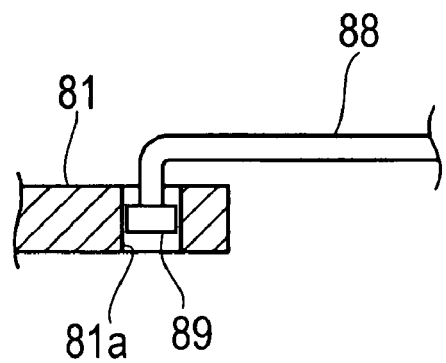
FIG. 18 is a side view showing an end portion of the coupling member.

FIG. 17 is an enlarged view showing an example of a linking structure between the coupling member 88 and the base member 81 shown in FIG. 16. FIG. 18 is a side view showing an end portion of the coupling member 88. As shown in FIG. 17, the base member 81 has an elongated hole 81a extending obliquely with respect to a movement direction (indicated by arrow) of the coupling member 88. As shown in FIG. 18, end portions of the coupling member 88 are bent to form bent portions extending vertically. The coupling member 88 has two circular slide members 89 (only one of the slide members 89 is illustrated in FIGS. 17 and 18), which are fixed respectively to tip ends of the coupling member 88 (i.e., tip ends of the bent portions). These slide members 89 are loosely fitted into the elongated holes 81a of the base members 81, so that the slide members 89 are movable within the elongated holes 81a.

With this arrangement, as the air cylinder 84 moves the coupling member 88, the base members 81 and 81 rotate about the shaft members 80 and 80, respectively, in directions opposite to one another. Instead of the slide members 89 and 89, rollers, which are rotatable about their own axes, may be used.

Figure 19:
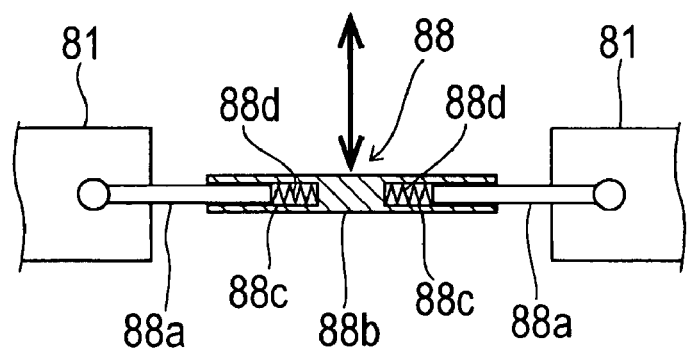
FIG. 19 is an enlarged view showing another example of a linking structure between the coupling member and the base members shown in FIG. 16.

FIG. 19 is an enlarged view showing another example of a linking structure between the coupling member 88 and the base members 81 and 81 shown in FIG. 16. As shown in FIG. 19, in this example, coupling member 88 comprises two connection bars 88a and 88a, and a housing member 88b having holes 88c and 88c. The connection bars 88a and 88a are slidably inserted into the holes 88c and 88c. These holes 88c and 88c are formed on both side portions of the housing member 88b, and are collinearly aligned. Springs 88d and 88d are provided respectively in the holes 88c and 88c. These springs 88d and 88d may be omitted.

The housing member 88b is fixed to the air cylinder 84 (see FIG. 16), so that the housing member 88b can be moved together with the connection bars 88a and 88a by the air cylinder 84 in a direction as indicated by the arrow shown in FIGS. 16 and 19. End portions of the connection bars 88a and 88a are rotatably connected to the base members 81 and 81, respectively. In this example, an elongated hole is not formed in the base members 81 and 81. With this arrangement, as the air cylinder 84 moves the coupling member 88, the base members 81 and 81 rotate about the shaft members 80 and 80, respectively, in directions opposite to one another, as with the above example.

As shown in FIG. 16, the air cylinder 84 is connected to a first gas supply line 101 and a second gas supply line 102, so that a pressurized gas (e.g., pressurized air or pressurized inert gas) is supplied from a non-illustrated gas supply source to the air cylinder 84 via the first gas supply line 101 and the second gas supply line 102 alternately. More specifically, when the pressurized gas is supplied to the air cylinder 84 via the first gas supply line 101, the base members 81 and 81 rotate in the directions such that the clamp rollers 85 and 85 move toward the substrate W, whereby the substrate W is held by the clamp rollers 85, 85, 86 and 86. On the other hand, when the pressurized gas is supplied to the air cylinder 84 via the second gas supply line 102, the base members 81 and 81 rotate in the directions such that the clamp rollers 85 and 85 move away from the substrate W, whereby the substrate W is released from the clamp rollers 85, 85, 86 and 86.

An electropneumatic regulator (a pressure adjustment mechanism) 103 for adjusting pressure of the pressurized gas to be supplied to the air cylinder 84 is provided in the first gas supply line 101. The electropneumatic regulator 103 performs feedback control so as to adjust the pressure of the pressurized gas to be supplied to the air cylinder 84. More specifically, the electropneumatic regulator 103 adjusts the pressure of the pressurized gas to a predetermined pressure based on a signal from a non-illustrated pressure sensor. Holding pressures applied from the clamp rollers 85, 85, 86 and 86 to the substrate W depend on the pressure of the pressurized gas supplied to the air cylinder 84 via the first gas supply line 101. Therefore, the electropneumatic regulator 103 serves as a holding pressure adjustment mechanism.

Next, operations of the seventh embodiment will be described. After the wafer transfer mechanism 40 (see FIG. 8) transfers a substrate W, the pressurized gas is supplied to the air cylinder 84 via the first gas supply line 101. The air cylinder 84 causes the base members 81 and 81 to rotate about the shaft members 80 and 80 in the opposite directions, whereby the clamp rollers 85 and 85 are brought into contact with the periphery of the substrate W. At the same time as or immediately after the clamp rollers 85 and 85 come into contact with the substrate W, the periphery of the substrate W is brought into contact with the clamp rollers 86 and 86. In this manner, the substrate W is held by the four clamp rollers 85, 85, 86 and 86. FIG. 16 shows a state in which the substrate W is held by the clamp rollers 85, 85, 86 and 86.

At least one of the clamp rollers 85, 85, 86 and 86 is rotated by a non-illustrated motor (rotating device), so that the substrate W can be held and rotated by the clamp rollers 85, 85, 86 and 86. Because the clamp rollers 86 and 86 are arranged to just move around the shaft member 82, a position of the substrate W, held by the clamp rollers 85, 85, 86 and 86, can be kept substantially constant. While the substrate W is held, the pressure of the pressurized gas supplied to the air cylinder 84 is kept constant by the electropneumatic regulator 103.

Eighth Embodiment

Another Example of Substrate Holding Rotating Mechanism

Next, a substrate holding rotating mechanism according to an eighth embodiment of the present invention will be described. This substrate holding rotating mechanism has basically the same structures as those of the seventh embodiment, but is different from the seventh embodiment in that a sensor is provided for detecting a degree of wear of the clamp rollers.

Figure 20:
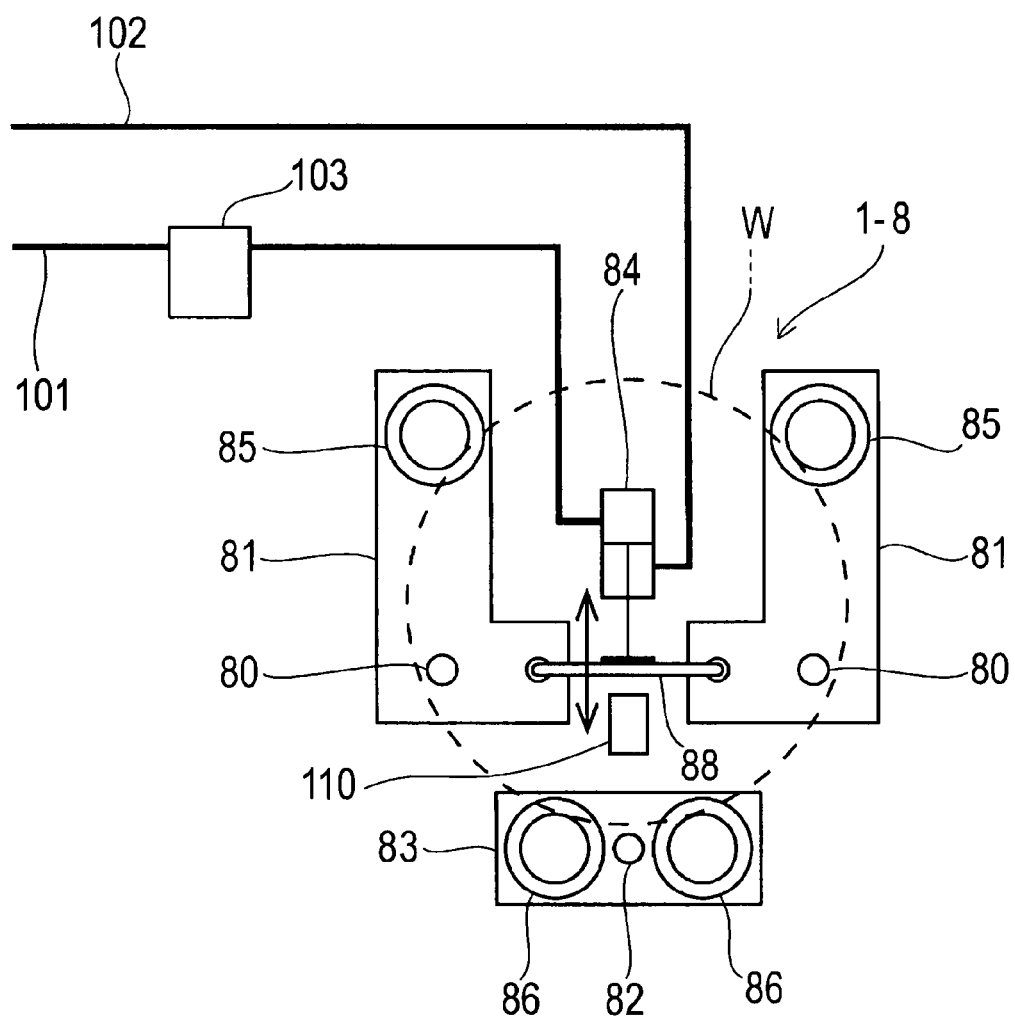
FIG. 20 is a schematic view showing a substrate holding rotating mechanism according to an eighth embodiment of the present invention.

FIG. 20 is a schematic view showing a substrate holding rotating mechanism 1-8 as viewed from above according to the eighth embodiment of the present invention. As shown in FIG. 20, a sensor 110 is provided near coupling member 88 so as to detect a position of the coupling member 88 when clamp rollers 85, 85, 86 and 86 hold a substrate W. The position of the coupling member 88 changes in accordance with a degree of wear of the clamp rollers 85, 85, 86 and 86. Thus, the degree of wear of the clamp rollers 85, 85, 86 and 86 can be detected from a change in position of the coupling member 88. A known displacement sensor of contact type or non-contact type can be used as the sensor 110.

Ninth Embodiment

Another Example of Substrate Holding Rotating Mechanism

Next, a substrate holding rotating mechanism according to a ninth embodiment of the present invention will be described. This substrate holding rotating mechanism has basically the same structures as those of the seventh embodiment, but is different from the seventh embodiment in that substrate push-out members are provided for pushing a substrate W when the substrate W is released from clamp rollers.

Figure 21:
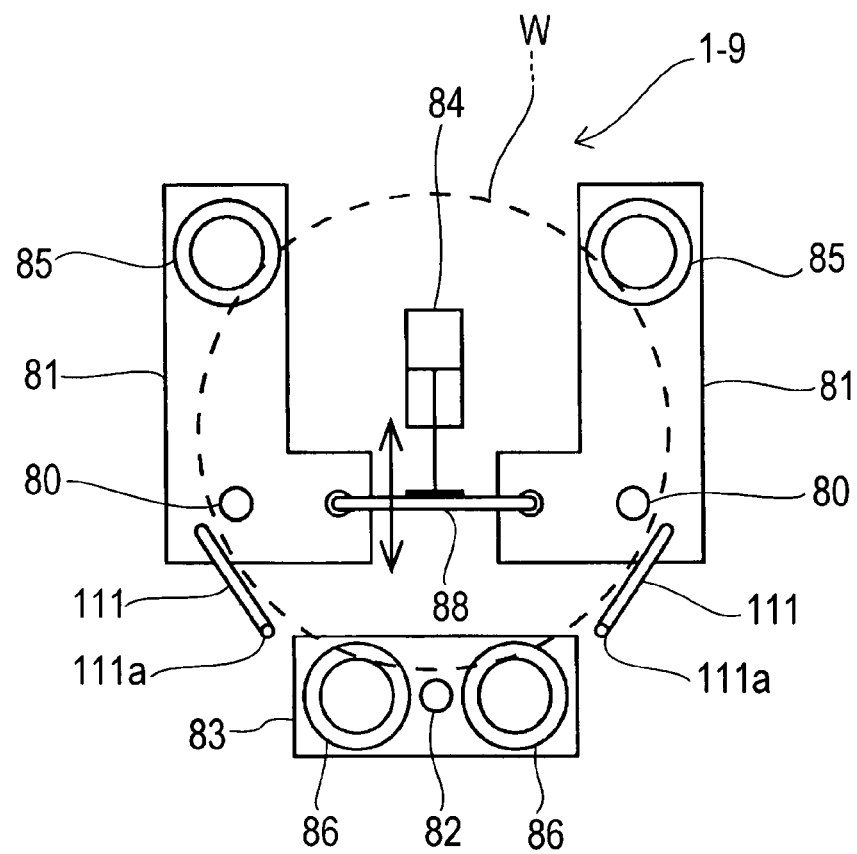
FIG. 21 is a schematic view showing a substrate holding rotating mechanism according to a ninth embodiment of the present invention.
Figure 22:
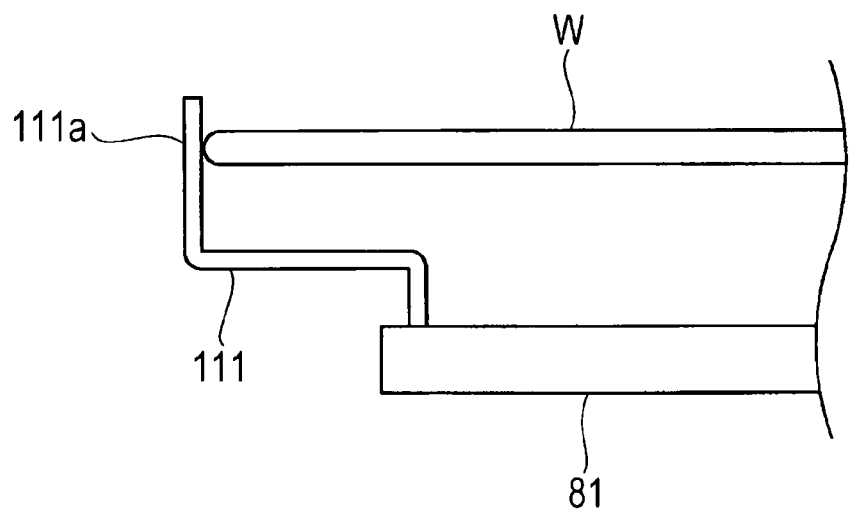
FIG. 22 is a side view showing a substrate push-out member.

FIG. 21 is a schematic view showing a substrate holding rotating mechanism 1-9 as viewed from above according to the ninth embodiment of the present invention. FIG. 21 also shows a state in which a substrate W is held by clamp rollers. Substrate push-out members 111 and 111 are provided on base members 81 and 81, respectively. FIG. 22 is a side view showing the substrate push-out member. As shown in FIG. 22, one end portion of the substrate push-out member 111 is fixed to the base member 81, and another extends vertically. This vertically extending end portion serves as a contact portion 111a that is to come into contact with the substrate W.

The contact portion 111a is located at an opposite side of clamp roller 85 with respect to shaft member 80. With this arrangement, when the clamp roller 85 moves away from the substrate W, the contact portion 111a moves toward the substrate W. A roller may be mounted on the contact portion 111a. The contact portion 111a has a circular cross section so as to minimize a contact area between the periphery of the substrate W and the contact portion 111a. As shown in FIG. 21, when the substrate W is held by the clamp rollers 85, 85, 86 and 86, the substrate push-out members 111 and 111 are away from the substrate W.

When the base members 81 and 81 rotate about the shaft members 80 and 80 in directions such that the clamp rollers 85 and 85 move away from the substrate W, the contact portions 111a and 111a of the substrate push-out members 111 and 111 are brought into contact with the periphery of the substrate W to thereby push the substrate W horizontally. As a result, the periphery of the substrate W is released from clamp grooves (see the reference numeral 52a in FIG. 7) of the clamp rollers 86 and 86. Thus, wafer transfer mechanism 40 (see FIG. 8) can lift up the substrate W as it is and can remove it from the wafer clamp position. In this manner, because the periphery of the substrate W comes off the clamp grooves of the clamp rollers 86 and 86 at the same time as the clamp rollers 85 and 85 separate from the substrate W, the substrate W can be quickly removed. Only one substrate push-out member may be provided. In this case, the substrate push-out member is provided on one of the base members 81 and 81.

Tenth Embodiment

Another Example of Substrate Holding Rotating Mechanism

Next, a substrate holding rotating mechanism according to a tenth embodiment of the present invention will be described. Components and operations identical to those of the seventh embodiment will not be described repetitively.

Figure 23:
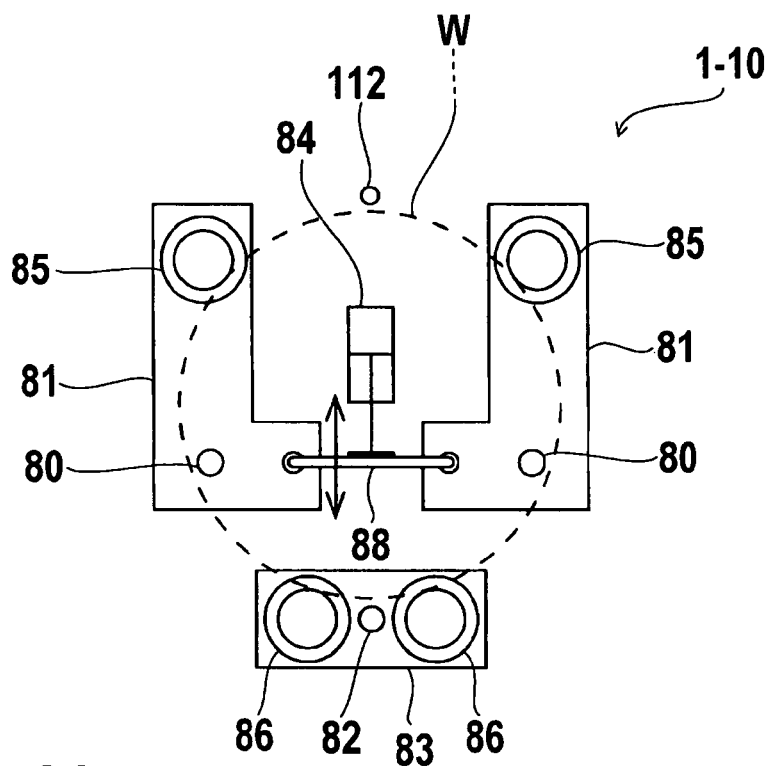
FIG. 23 is a schematic view showing a substrate holding rotating mechanism according to a tenth embodiment of the present invention.
Figure 24:
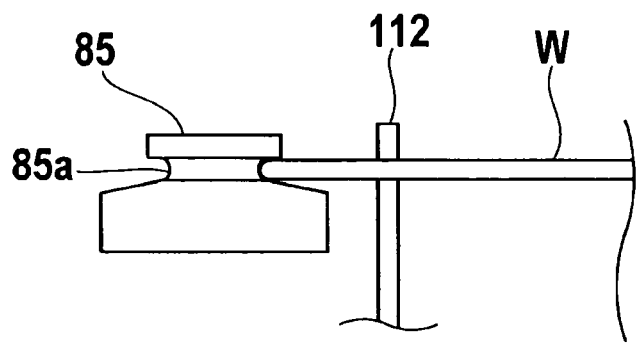
FIG. 24 is a side view schematically showing part of the substrate holding rotating mechanism shown in FIG. 23.

FIG. 23 is a schematic view showing a substrate holding rotating mechanism 1-10 according to the tenth embodiment of the present invention. FIG. 24 is a side view schematically showing part of the substrate holding rotating mechanism shown in FIG. 23. As shown in FIG. 23, a substrate stopper 112 is provided near a periphery of a substrate W held by clamp rollers 85, 85, 86 and 86. This substrate stopper 112 extends vertically, and has an upper end positioned above the substrate W. The substrate stopper 112 is fixed in position. The substrate stopper 112 is located between the clamp rollers 85 and 85. Further, the substrate stopper 112 and second base member 83 are substantially symmetrical about a center of the substrate W.

As shown in FIG. 24, the substrate W is held by the clamp rollers 85, 85, 86 and 86 with the periphery thereof fitted into clamp grooves formed on circumferential surfaces of the clamp rollers 85, 85, 86 and 86 (FIG. 24 illustrates only one clamp roller 85 and only one clamp groove 85a). Accordingly, when base members 81 and 81 rotate so as to move the clamp rollers 85 and 85 in a direction away from the substrate W, the clamp grooves 85a and 85a of the clamp rollers 85 and 85 would drag the substrate W, causing the substrate W to move horizontally together with the clamp rollers 85 and 85. According to this embodiment, because the substrate stopper 112 is disposed near the periphery of the substrate W, the substrate stopper 112 can stop the horizontal movement of the substrate W. As a result, the substrate W can be disengaged from the clamp grooves 85a and 85a.

Eleventh Embodiment

Another Example of Substrate Holding Rotating Mechanism

Next, a substrate holding rotating mechanism according to an eleventh embodiment of the present invention will be described. Components and operations identical to those of the seventh embodiment will not be described repetitively.

Figure 25:
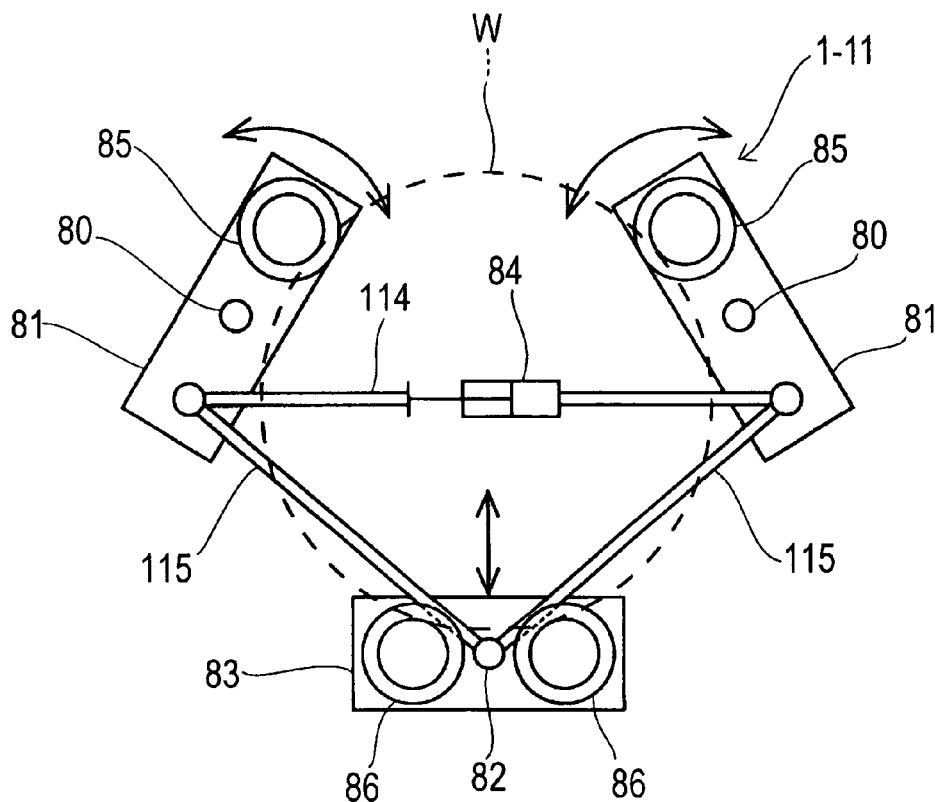
FIG. 25 is a schematic view showing a substrate holding rotating mechanism according to an eleventh embodiment of the present invention.

FIG. 25 is a schematic view showing a substrate holding rotating mechanism 1-11 as viewed from above according to the eleventh embodiment of the present invention. As shown in FIG. 25, base members 81 and 81 are coupled to one another via a first coupling member 114. Air cylinder 84 constitutes part of the first coupling member 114, so that operation of the air cylinder 84 causes the first coupling member 114 to extend and contract. Both end portions of the first coupling member 114 are rotatably connected to the base members 81 and 81, respectively.

The base members 81 and 81 are further coupled to a shaft member (second shaft member) 82 via second coupling members 115 and 115. Both end portions of each of the second coupling members 115 and 115 are rotatably connected to the base member 81 and the shaft member 82, respectively. The second coupling members 115 and 115 have the same length as one another. Therefore, the first coupling member 114 and the second coupling members 115 and 115 as a whole form an isosceles triangle. The shaft member 82 is mounted on a non-illustrated guide rail and is thus movable in a radial direction of the substrate W (i.e., in a direction toward and away from the substrate W).

Figure 26:
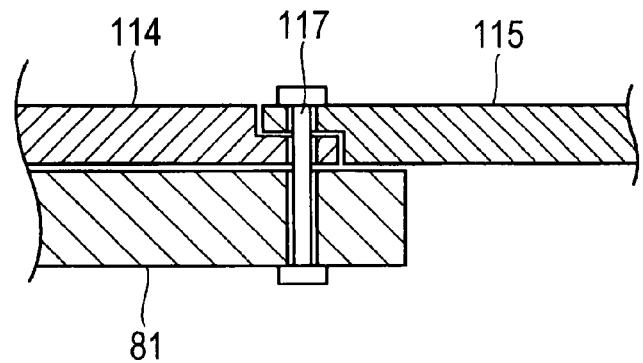
FIG. 26 is a cross-sectional view schematically showing an example of a linking structure between a base member, a first coupling member, and a second coupling member.

FIG. 26 is a cross-sectional view schematically showing an example of a linking structure between the base member 81, the first coupling member 114, and the second coupling member 115. As shown in FIG. 26, a hinge pin 117 is inserted into a hole passing through the base member 81, the first coupling member 114, and the second coupling member 115. The base member 81, the first coupling member 114, and the second coupling member 115 are rotatable about the hinge pin 117.

With this arrangement, operation of the air cylinder 84 causes the first coupling member 114 to extend and contract to thereby rotate the base members 81 and 81 in directions opposite to one another. Further, the base member 83 is moved so as to follow the extension and contraction of the first coupling member 114. More specifically, when the base members 81 and 81 rotate in directions such that the clamp rollers 85 and 85 move toward the substrate W, the base member 83 moves toward the substrate W. On the other hand, when the base members 81 and 81 rotate in directions such that the clamp rollers 85 and 85 move away from the substrate W, the base member 83 also moves away from the substrate W. In this manner, the four clamp rollers 85, 85, 86 and 86 move simultaneously toward and away from the substrate W.

Twelfth Embodiment

Another Example of Substrate Holding Rotating Mechanism

Next, a substrate holding rotating mechanism according to a twelfth embodiment of the present invention will be described. This substrate holding rotating mechanism has basically the same structures as those of the eleventh embodiment, but is different from the eleventh embodiment in that a sensor is provided for detecting a degree of wear of clamp rollers.

Figure 27:
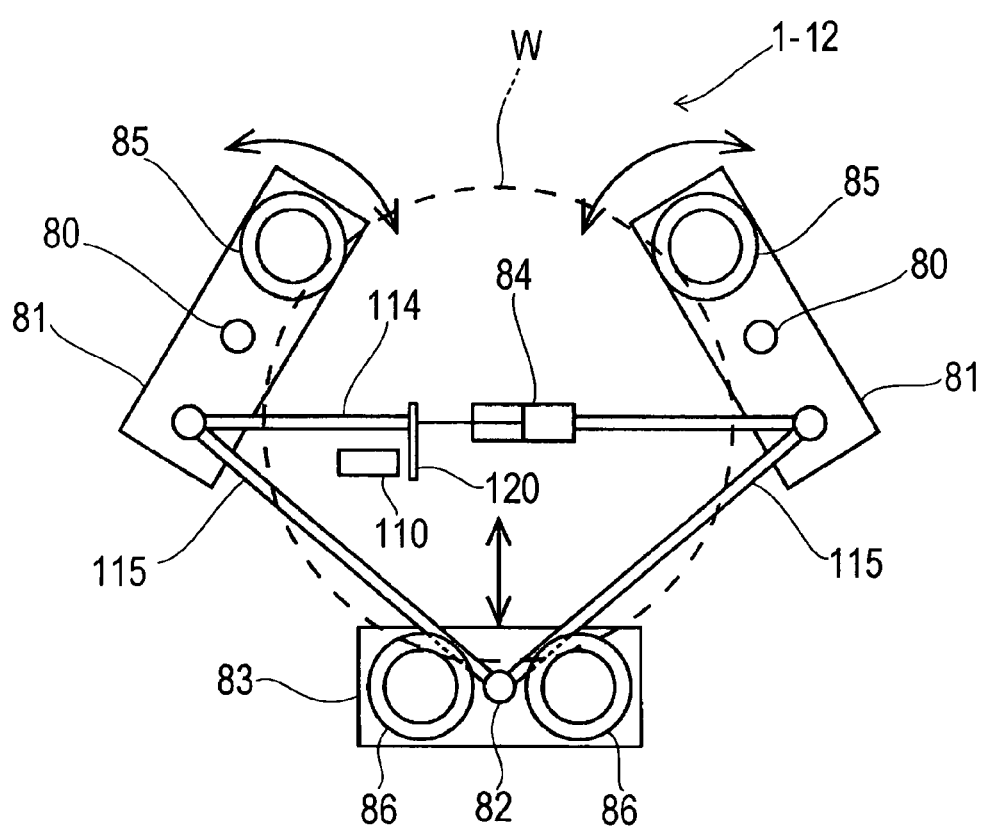
FIG. 27 is a schematic view showing a substrate holding rotating mechanism according to a twelfth embodiment of the present invention.

FIG. 27 is a schematic view showing a substrate holding rotating mechanism 1-12 as viewed from above according to the twelfth embodiment of the present invention. As shown in FIG. 27, a target 120 is fixed to first coupling member 114. Sensor 110 is provided near the target 120 so as to detect a position of the target 120 when clamp rollers 85, 85, 86 and 86 hold a substrate W. The position of the target 120 changes in accordance with a degree of wear of the clamp rollers 85, 85, 86 and 86. Thus, the degree of wear of the clamp rollers 85, 85, 86 and 86 can be detected from a change in position of the target 120. As with the eighth embodiment, a known displacement sensor of contact type or non-contact type can be used as the sensor 110.

Thirteenth Embodiment

A Substrate Processing Apparatus

Figure 28:
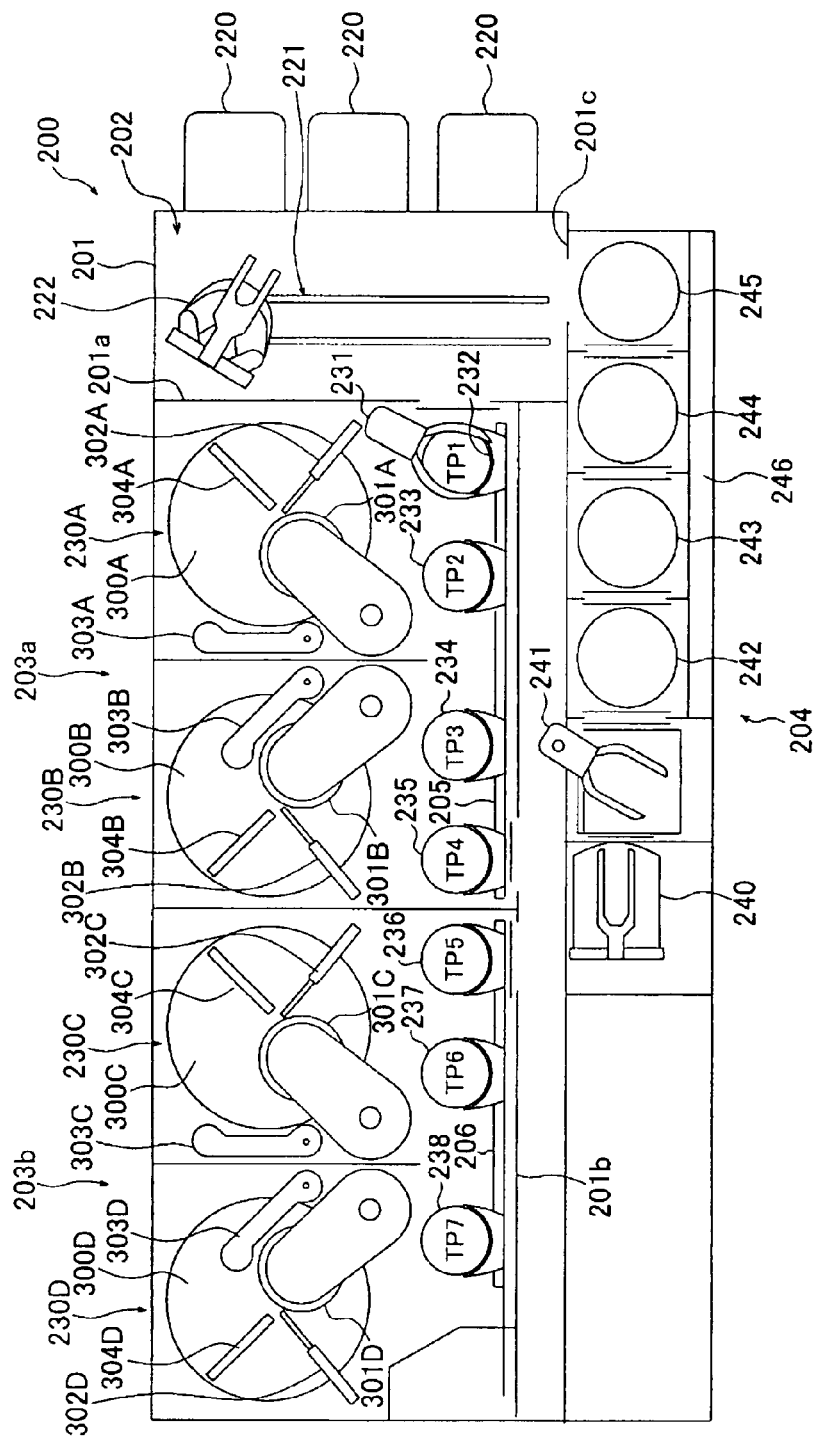
FIG. 28 is a schematic view showing a substrate processing apparatus according to a thirteenth embodiment of the present invention.

Next, a substrate processing apparatus having the above-described substrate cleaning apparatus will be described. FIG. 28 is a schematic plan view showing structures of the substrate processing apparatus. The substrate processing apparatus 200 shown in FIG. 28 comprises a substantially rectangular housing 201. An inner space of the housing 201 is divided by partition 201a, 201b and 201c into a loading/unloading section 202, a polishing section 203 (203a and 203b), and a cleaning section 204.

The loading/unloading section 202 has at least two (three in this embodiment) front load units 220. Wafer cassettes, each storing a number of wafers (substrates) therein, are placed on the front load units 220. These units 220 are installed on a side portion of the housing 201 and are arranged in a width direction of the substrate processing apparatus 200 (i.e., in a direction perpendicular to a longitudinal direction of the substrate processing apparatus 200). Open cassettes, SMIF (Standard Manufacturing Interface) pods, or FOUPs (Front Opening Unified Pod) are to be placed on the front load units 220. The SMIF pod and FOUP are a hermetically sealed container having partition walls in which a wafer cassette is housed and can thus maintain its internal environment independently of an external space.

The loading/unloading section 202 has a moving mechanism 221 extending along an arrangement direction of the front load units 220. A first transfer robot 222 is movably installed on the moving mechanism 221. This first transfer robot 222 is operable to move along the moving mechanism 221 so as to access the wafer cassettes mounted on the front load units 220. Although not shown in detail in the drawing, the first transfer robot 222 has vertically arranged two hands, which are separately used. For example, the upper hand can be used for returning a polished wafer to the wafer cassette, and the lower hand can be used for transferring a non-polished wafer.

The polishing section 203 is an area where the wafer is polished as a pre-treatment. This polishing section 203 includes a first polishing section 203a having a first polishing unit 230A and a second polishing unit 230B, and a second polishing section 203b having a third polishing unit 230C and a fourth polishing unit 230D. The first polishing unit 230A comprises a polishing table 300A having a polishing surface, a top ring 301A adapted to hold the wafer and to press the wafer against the polishing table 300A, a polishing liquid supply nozzle 302A for supplying a polishing liquid or dressing liquid (e.g., water) onto the polishing table 300A, a dresser 303A for dressing the polishing table 300A, and an atomizer 304A having one or more nozzles for spraying a mixture of a liquid (e.g., pure water) and a gas (e.g., nitrogen) to the polishing surface. This first polishing unit 230A polishes a wafer as follows. While the polishing table 300A rotates, the top ring 301A holds a wafer on its lower surface, brings the wafer to a polishing position on the polishing table 300A, and rotates the wafer. While slurry is supplied onto an upper surface (i.e., the polishing surface) of the polishing table 300A through the polishing liquid supply nozzle 302A, the top ring 301A presses a surface of the wafer against the polishing surface of the polishing table 300A. In this manner, the surface of the wafer is polished by relative movement between the wafer and the polishing surface.

The second polishing unit 230B comprises a polishing table 300B, a top ring 301B, a polishing liquid supply nozzle 302B, a dresser 303B, and an atomizer 304B. The third polishing unit 230C comprises a polishing table 300C, a top ring 301C, a polishing liquid supply nozzle 302C, a dresser 303C, and an atomizer 304C. The fourth polishing unit 230D comprises a polishing table 300D, a top ring 301D, a polishing liquid supply nozzle 302D, a dresser 303D, and an atomizer 304D. The second polishing unit 230B, the third polishing unit 230C, and the fourth polishing unit 230D polish a wafer in the same manner as that of the above-described first polishing unit 230A.

A first linear transporter 205 is disposed between the first polishing section 203a and the cleaning section 204 for transferring a wafer between four transferring positions located along the longitudinal direction of the substrate processing apparatus 200 (hereinafter, these four transferring positions will be referred to a first transferring position TP1, a second transferring position TP2, a third transferring position TP3, and a fourth transferring position TP4 in the order from the loading/unloading section 202). A reversing machine 231 for reversing a wafer received from the first transfer robot 222 of the loading/unloading section 202 is disposed above the first transferring position TP1 of the first linear transporter 205, and a vertically movable lifter 232 is disposed below the first transferring position TP1. A vertically movable pusher 233 is disposed below the second transferring position TP2, a vertically movable pusher 234 is disposed below the third transferring position TP3, and a vertically movable lifter 235 is disposed below the fourth transferring position TP4.

A second linear transporter 206 is disposed in the second polishing section 203b adjacent to the first linear transporter 205 for transferring a wafer between three transferring positions located along the longitudinal direction of the substrate processing apparatus 200 (hereinafter, these three transferring positions will be referred to a fifth transferring position TP5, a sixth transferring position TP6, and a seventh transferring position TP7 in the order from the loading/unloading section 202). A vertically movable lifter 236 is disposed below the fifth transferring position TP5 of the second linear transporter 206, a pusher 237 is disposed below the sixth transferring position TP6, and a pusher 238 is disposed below the seventh transferring position TP7.

The cleaning section 204 is an area where a wafer, which has been polished, is cleaned as a post-treatment. The cleaning section 204 comprises a second transfer robot 240, a reversing machine 241 for reversing a wafer received from the second transfer robot 240, four cleaning devices 242-245 for cleaning a wafer which has been polished, and a transfer unit 246 for transferring a wafer between the reversing machine 241 and the cleaning devices 242-245. The second transfer robot 240, the reversing machine 241, and the cleaning devices 242-245 are arranged in series along the longitudinal direction of the substrate processing apparatus 200.

Next, the cleaning devices 242-245 in the cleaning section 204 will be described below. The primary cleaning device 242 and the secondary cleaning device 243 may comprise a substrate cleaning apparatus (i.e., a roll-type cleaning apparatus) according to the first embodiment as described above. The tertiary cleaning device 244 may comprise a pencil-type cleaning device which rotates and presses a hemispherical sponge against a wafer so as to clean the wafer. The quaternary cleaning device 245 may comprise a pencil-type cleaning device which rinses a reverse side of a wafer and rotates and presses a hemispherical sponge against a front side of the wafer so as to clean the wafer. Although not shown in detail in the drawings, the quaternary cleaning device 245 has a stage for rotating a chucked wafer at a high rotational speed, and thus has a function (spin-drying function) to dry a cleaned wafer by rotating a wafer at a high rotational speed. In the cleaning devices 242-245, a megasonic-type cleaning device which applies ultrasonic waves to a cleaning liquid may be provided in addition to the roll-type cleaning device described above.

Next, a wafer polishing process and a wafer cleaning process using the above-described substrate processing apparatus 200 will be described. The following descriptions are an example of serial processing of a wafer. First, a wafer is transferred from the wafer cassette on the front load unit 220 to the top ring 301A via the first transfer robot 222, the reversing machine 231, the lifter 232, a transport stage (not shown) of the first linear transporter 205, and the pusher 233 in this order. Then, the wafer is polished on the polishing table 300A. After polishing, the wafer is transferred to the top ring 301B via the pusher 233, the transport stage of the first linear transporter 205, and the pusher 234 in this order. Then, the wafer is polished on the polishing table 300B. Thereafter, the wafer is transferred to the top ring 301C via the pusher 234, the transport stage of the first linear transporter 205, the lifter 235, the second transfer robot 240, the lifter 236, a transport stage (not shown) of the second linear transporter 206, and the pusher 237 in this order. Then, the wafer is polished on the polishing table 300C. Further, the wafer is transferred to the top ring 301D via the pusher 237, the transport stage of the second linear transporter 206, and the pusher 238 in this order. Then, the wafer is polished on the polishing table 300D.

The polished wafer is transferred to the primary cleaning device 242 via the pusher 238, the transport stage of the second linear transporter 206, the lifter 236, the second transfer robot 240, the reversing machine 241, and a chucking unit (not shown in the drawing) of the transfer unit 246 in this order. Then, the primary cleaning device 242 performs a primary cleaning process on the wafer. This primary cleaning process is performed in the same manner as that described in the first embodiment of the substrate cleaning apparatus. Thereafter, the wafer is transferred to the secondary cleaning device 243 via the chucking unit of the transfer unit 246. The secondary cleaning device 243 performs a secondary cleaning process on the wafer. Further, the wafer is transferred to the tertiary cleaning device 244 via the chucking unit of the transfer unit 246. The tertiary cleaning device 244 performs a tertiary cleaning process on the wafer. Further, the wafer is transferred to the quaternary cleaning device 245 via the chucking unit of the transfer unit 246. The quaternary cleaning device 245 performs a quaternary cleaning process on the wafer. Thereafter, the wafer is returned to the wafer cassette on the front load unit 220 via the first transfer robot 222.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

For example, the specific structure of the rotational mechanism of the first moving mechanism 10 is not limited to that of the above embodiments, and other structures can be applied so long as the base member 17 is allowed to rotate so as to adjust the holding pressures of the clamp rollers 52 applied to the substrate W. Further, a mechanism of rotating the clamp rollers 52 on the spindles 50 is not limited to that of the above embodiments. For example, only one of the clamp rollers 52 may be rotated by the motor 28, and other clamp rollers 52 may be rotated by the rotation of the substrate W.

The number of spindles 50 provided in the respective spindle groups 53 and 54 is not limited to that in the above embodiments. For example, four or more spindles 50 may be provided in each of the spindle groups 53 and 54. Further, the specific structure of the substrate cleaning apparatus is not limited to that of the above embodiments. For example, the substrate cleaning apparatus may have either the upper cleaning tool 61 or the lower cleaning tool 62.

The substrate processing apparatus having the substrate holding rotating mechanism 1 is not limited to the above-described substrate cleaning apparatus. The substrate holding rotating mechanism 1 can be widely applied to any type of substrate processing apparatus which holds and rotates a wafer during processing. For example, the substrate holding rotating mechanism 1 can be applied to an apparatus for polishing a substrate, an apparatus for etching a substrate, an apparatus for polishing a bevel portion (a periphery) of a substrate, an apparatus for etching a bevel portion of a substrate, and the like.

In the substrate processing apparatus 200 according to the thirteenth embodiment, the polishing section 203 performs the polishing process as a pre-treatment of a wafer and the primary and secondary cleaning devices 242 and 243, each having the substrate holding rotating mechanism, perform the cleaning process as a post-treatment of the wafer. However, the pre-treatment and the post-treatment to be performed in the substrate processing apparatus according to the present invention are not limited to the polishing process and the cleaning process. For example, the pre-treatment may be an etching process of a wafer, and the post-treatment may be a dry process of a wafer.

What is claimed is:

1. A substrate holding rotating mechanism, comprising:
   at least three spindles;
   clamp rollers mounted respectively on said spindles for holding a periphery of a substrate;
   a rotating device for rotating at least one of said clamp rollers;
   a base member on which at least two of said spindles are mounted; and
   a rotational mechanism including a shaft member mounted to said base member, said shaft member being non-coaxial with respect to a center of rotation of the substrate, said rotational mechanism being configured to allow said base member to freely rotate about said shaft member such that said base member is free to rotate about said shaft member while said clamp rollers hold the periphery of the substrate and rotate the substrate, so as to adjust holding pressures of said clamp rollers applied to the substrate.

2. The substrate holding rotating mechanism according to claim 1, further comprising:
   a reciprocating mechanism for moving said base member forward and backward in a direction such that said at least two spindles on said base member move between a substrate clamp position and a waiting position that is away from the substrate clamp position.

3. The substrate holding rotating mechanism according to claim 2, wherein:
   said base member comprises one of a plurality of base members; and
   each of said plurality of base members is provided with at least one of a respective rotational mechanism and a respective reciprocating mechanism.

4. A substrate processing apparatus, comprising:
   said substrate holding rotating mechanism according to claim 1;
   a processing liquid supply mechanism for supplying a processing liquid to the substrate; and
   a substrate processing section for processing the substrate.

5. The substrate processing apparatus according to claim 4, further comprising:
   a pre-treatment unit for performing a pre-treatment on the substrate before said substrate processing section processes the substrate,
   wherein said substrate processing section performs a post-treatment on the substrate after said pre-treatment unit performs the pre-treatment on the substrate.

6. The substrate processing apparatus according to claim 5, wherein:
   said pre-treatment unit is operable to perform a polishing process on the substrate; and said substrate processing section is operable to perform a cleaning process on the substrate.

7. The substrate holding rotating mechanism according to claim 1, wherein said base member comprises a first base member, further comprising a second base member, each of said first base member and said second base member having at least two of said spindles mounted thereon.

8. The substrate holding rotating mechanism according to claim 7, further comprising:
   a first reciprocating mechanism for moving said first base member forward and backward in a direction such that said at least two spindles on said first base member move between a substrate clamp position and a waiting position that is away from the substrate clamp position; and
   a second reciprocating mechanism for moving said second base member forward and backward in a direction such that said at least two spindles on said second base member move between a substrate clamp position and a waiting position that is away from the substrate clamp position.

9. The substrate holding rotating mechanism according to claim 8, wherein said rotational mechanism comprises a first rotational mechanism configured to allow said first base member to rotate, further comprising a second rotational mechanism configured to allow said second base member to rotate.

10. The substrate holding rotating mechanism according to claim 7, wherein said rotational mechanism comprises a first rotational mechanism configured to allow said first base member to rotate, further comprising a second rotational mechanism configured to allow said second base member to rotate.

* * * * *